US009831362B2

(12) United States Patent
Fan et al.

(10) Patent No.: US 9,831,362 B2
(45) Date of Patent: Nov. 28, 2017

(54) ROLL-TO-ROLL FABRICATION OF ORDERED THREE-DIMENSIONAL NANOSTRUCTURE ARRAY, RELATED TECHNIQUES, MATERIALS AND PRODUCTS

(71) Applicant: The Hong Kong University of Science and Technology, Kowloon (HK)

(72) Inventors: Zhiyong Fan, Kowloon (HK); Siu-Fung Leung, Kowloon (HK)

(73) Assignee: THE HONG KONG UNIVERSITY OF SCIENCE AND TECHNOLOGY, Kowloon (HK)

( * ) Notice: Subject to any disclaimer, the term of this patent is extended or adjusted under 35 U.S.C. 154(b) by 741 days.

(21) Appl. No.: 14/202,436

(22) Filed: Mar. 10, 2014

(65) Prior Publication Data
US 2014/0295208 A1   Oct. 2, 2014

Related U.S. Application Data

(60) Provisional application No. 61/853,144, filed on Mar. 29, 2013.

(51) Int. Cl.
*H01L 31/0236* (2006.01)
*C23F 1/36* (2006.01)

(52) U.S. Cl.
CPC ........ *H01L 31/02366* (2013.01); *Y02E 10/50* (2013.01); *Y10T 428/12431* (2015.01); *Y10T 428/24479* (2015.01); *Y10T 428/24521* (2015.01); *Y10T 428/24545* (2015.01); *Y10T 428/24612* (2015.01)

(58) Field of Classification Search
None
See application file for complete search history.

(56) References Cited

U.S. PATENT DOCUMENTS

| 3,426,421 | A | * | 2/1969 | Leedy et al. ....... B29D 99/0057 164/98 |
| 7,109,517 | B2 | | 9/2006 | Zaidi |
| 7,563,722 | B2 | | 7/2009 | Yaniv et al. |
| 7,799,182 | B2 | | 9/2010 | Lopatin et al. |
| 7,915,522 | B2 | | 3/2011 | Petti |
| 7,923,281 | B2 | | 4/2011 | Basol et al. |
| 7,938,640 | B2 | | 5/2011 | Yamada et al. |
| 7,964,433 | B2 | | 6/2011 | Bae et al. |
| 8,027,086 | B2 | * | 9/2011 | Guo ....................... B82Y 40/00 264/1.31 |

(Continued)

OTHER PUBLICATIONS

Lee, et al. ("Roll-to-roll anodization and etching of aluminum foils for high-throughput surface nano-texturing," Nano Letters 11,2011, 3425-3430, 12 Pages).*

(Continued)

*Primary Examiner* — Shamim Ahmed
(74) *Attorney, Agent, or Firm* — Amin, Turocy & Watson, LLP

(57) ABSTRACT

Roll-to-roll fabrication of predetermined or ordered three-dimensional nanostructure arrays is described. Provided methods can comprise imprinting a substrate with a two-dimensional (2-D) pattern by rolling a cylindrical pattern comprising a 2-D array of structures against a substrate. In addition, control or determination of nanostructure parameters via control of process parameters is provided.

22 Claims, 19 Drawing Sheets

(56) References Cited

U.S. PATENT DOCUMENTS

| | | | |
|---|---|---|---|
| 8,088,224 B2 | 1/2012 | Vasquez et al. | |
| 8,120,027 B2 | 2/2012 | Forbes | |
| 8,153,889 B2 | 4/2012 | Basol | |
| 8,212,250 B2 | 7/2012 | Forbes | |
| 8,298,339 B2 | 10/2012 | Vijh et al. | |
| 2005/0155713 A1* | 7/2005 | Mathea | B65H 23/1882 156/361 |
| 2009/0266399 A1* | 10/2009 | Basol | H01L 31/0322 136/244 |
| 2011/0005412 A1* | 1/2011 | Fujii | B29C 59/04 101/216 |
| 2012/0135237 A1* | 5/2012 | Gracias | B81C 1/00007 428/402 |
| 2012/0168218 A1* | 7/2012 | Tomita | H01B 1/023 174/262 |

OTHER PUBLICATIONS

Garnett, et al. "Light Trapping in Silicon Nanowire Solar Cells," Nano Letters 10, 2010, 1082-1087, 13 pages.
Kulmala, et al. "Self-Aligned Coupled Nanowire Transistor", ACS Nano 5, Iss. 9, 2011, 6910-6915, 6 pages.
Fan, et al. "Three-dimensional nanopillar-array photovoltaics on low-cost and flexible substrates," Nature Materials 8, Aug. 2009, 18 pages.
Chang, et al. "Nanowire arrays with controlled structure profiles for maximizing optical collection efficiency," Energy Environmental Science 4, 2011, 2863-2869, 7 Pages.
Gabor, et al. Extremely Efficient Multiple Electron-Hole Pair Generation in Carbon Nanotube Photodiodes. Science 325, 2009, 1367-1371, 6 pages.
Tang, et al. "Vertically Aligned p-Type Single-Crystalline GaN Nanorod Arrays on n-Type Si for Heterojunction Photovoltaic Cells," Nano Letters 8, 2008, 4191-4195, 5 Pages.
Zhu, et al. "Nanodome solar cells with efficient light management and self-cleaning," Nano Letters 10, Iss. 6, 2010, 1979-1984, 6 Pages.
Hochbaum, et al. "Semiconductor Nanowires for Energy Conversion," Chemical Reviews 110, Iss. 1, 2010, 527-546, 28 pages.
Wu, et al. "Controlled Growth and Structures of Molecular-Scale Silicon Nanowires", Nano Letters 4, Iss. 3, 2004, 433-436, 4 pages.
Peng, et al. "High-Performance Silicon Nanohole Solar Cells" Journal of the American Chemical Society 132, 2010, 6872-6873, 2 pages.
Zaumseil, et al. "Three-Dimensional and Multilayer Nanostructures Formed by Nanotransfer Printing," Nano Letters 3, Iss. 9, 2003, 1223-1227, 5 pages.
Kim, et al. "Two-and three-dimensional crystallization of polymeric microspheres by micromolding in capillaries", Advanced Materials 8, Iss. 3, 1996, 245-247, 3 pages.
Park, et al. "Conformable Solid-Index Phase Masks Composed of High-Aspect-Ratio Micropillar Arrays and Their Application to 3D Nanopatterning", Advanced Materials 23, 2011, 860-864, 5 Pages.
Heitsch, et al. "Solution-Liquid-Solid (SLS) Growth of Silicon Nanowires" Journal of the American Chemical Society 130, 2008, 5436-5437, 2 Pages.
Søndergaard, et al. "Roll-to-roll fabrication of polymer solar cells" Materials Today 15, Nos. 1-2, Jan.-Feb., pp. 36-49, 14 Pages.
Sai, et al."Enhancement of light trapping in thin-film hydrogenated microcrystalline Si solar cells using back reflectors with self-ordered dimple pattern," Applied Physics Letters 93, 2008, 4 pages.
Surla, et al. "High-energy density beams and plasmas for micro- and nano-texturing of surfaces by rapid melting and solidification", Journal of Physics D-Applied Physics 44, 2011, 13 pages.
Lee, et al. "Nanostructured metal surfaces fabricated by a nonlithographic template method" Langmuir 20, 2004, pp. 287-290, 4 pages.

Soppe, et al. "Roll to Roll Fabrication of Thin Film Silicon Solar Cells on Nano-Textured Substrates", Journal of Nanoscience and Nanotechnology 11, 2011, 2 pages.
Izu, et al. "Roll-to-roll manufacturing of amorphous silicon alloy solar cells with in situ cell performance diagnostics", Solar Energy Materials and Solar Cells 78, Issue: 1-4, 2003, 613-626, 14 pages.
Lee, et al. "Self-ordering behavior of nanoporous anodic aluminum oxide (AAO) in malonic acid anodization" , Nanotechnology 18, 2007, 9 Pages.
Dou, et al. "Surface texturing of aluminum alloy 2024-T3 via femto- and nanosecond pulse excimer laser irradiation," Ieee Journal of Selected Topics in Quantum Electronics 6, No. 4, Jul.-Aug. 2000, 689-695, 7 pages.
Krebs, et al. "Upscaling of polymer solar cell fabrication using full roll-to-roll processing", Nanoscale 2, 2010, 873-886, 14 pages.
Lazo, et al. "UV-nanoimprint lithography and large area roll-to-roll texturization with hyperbranched polymer nanocomposites for light-trapping applications," Solar Energy Materials and Solar Cells 103, 2012, 147-156, 10 pages.
Caicedo-Martinez, et al. "Surface nanotextures on aluminium," Surfaces and Interface Analysis 34, 2002, 405-408, 4 pages.
Deceglie, et al. "Design of Nanostructured Solar Cells Using Coupled Optical and Electrical Modeling," Nano Letters 12, 2012, 2894-2900, 7 Pages.
Battaglia, et al. "Light trapping in solar cells: can periodic beat random?," ACS Nano 6, 2012, 2790-2797, 8 Pages.
Hsu, et al. "High-Efficiency Amorphous Silicon Solar Cell on a Periodic Nanocone Back Reflector," Advanced Energy Materials 2, Iss. 6, Jun. 2012, 628-633, 6 Pages.
Huang, et al. "Performance Enhancement of Thin-Film Amorphous Silicon Solar Cells with Low Cost Nanodent Plasmonic Substrates," Energy & Environmental Science 6, 2013, 2965-2971, 7 Pages.
Kim, et al. "Three-Dimensional a-Si:H Solar Cells on Glass Nanocone Arrays Patterned by Self-Assembled Sn Nanospheres," ACS Nano 6, 2012, 265-271, 7 Pages.
Zhou, et al. "Vertically Aligned CdSe Nanowire Arrays for Energy Harvesting and Piezotronic Devices," ACS Nano 6, 2012, 6478-6482, 5 Pages.
Paz-Soldan, et al. "Jointly Tuned Plasmonic-Excitonic Photovoltaics Using Nanoshells," Nano Letters 13, 2013, 1502-1508, 7 Pages.
Paudel, et al. "Nanocoax solar cells based on aligned multiwalled carbon nanotube arrays," Physical Status Solidi (A) 208, Iss. 4, 2011, 924-927, 4 Pages.
Gao, et al. "A ZnO nanorod layer with a superior light-scattering effect for dye-sensitized solar cells," RSC Advances 3, Iss. 40, Oct. 2013, 18537-18543, 6 Pages.
Fan, et al. "Ordered Arrays of Dual-Diameter Nanopillars for Maximized Optical Absorption," Nano Letters 10, 2010 3823-3827, 13 Pages.
Yu, et al. "Strong Light Absorption of Self-Organized 3-D Nanospike Arrays for Photovoltaic Applications," ACS Nano 5, Iss. 11, 2011, 9291-9298, 8 Pages.
Isomura, et al. "Dependence of Open-Circuit Voltage of Amorphous-Silicon Solar-Cells on Thickness and Doping Level of the P-Layer," Japanese Journal of Applied Physics 32, Iss. 5R,1993,1902-1907, 6 Pages.
Masuda, et al. "Ordered metal nanohole arrays made by a two-step replication of honeycomb structures of anodic alumina," Science 268, Jun. 1995, 1466-1468, 3 Pages.
Masuda, et al. "Self-ordering of cell configuration of anodic porous alumina with large-size pores in phosphoric acid solution," Japanese Journal of Applied Physics 37, 1998, L1340-L1342, 3 Pages.
Leung, et al. "Efficient Photon Capturing with Ordered Three-dimensional Nanowell Arrays," Nano Letters 12, 2012, 3682-3689, 8 Pages.
Lin, et al. "Efficient Light Absorption with Integrated Nanopillar/Nanowell Arrays for Three-Dimensional Thin-Film Photovoltaic Applications," ACS Nano 7, 2013, 2725-2732, 8 Pages.
Hua, et al. "Rational Geometrical Design of Multi-diameter Nanopillars for Efficient Light Harvesting," Nano Energy 2, Sep. 2013, 951-957, 7 Pages.

(56) References Cited

OTHER PUBLICATIONS

Han, et al. "Toward the Lambertian limit of light trapping in thin nanostructured silicon solar cells," Nano Letters 10, 2010, 4692-4696, 5 Pages.

Deceglie, et al. Accounting for Localized Defects in the Optoelectronic Design of Thin-Film Solar Cells. IEEE Journal of Photovoltaics 3, Iss. 2, Apr. 2013, 599-604, 6 Pages.

Fan, et al. "Challenges and Prospects of Nanopillar-Based Solar Cells," Nano Research 2, Iss. 11, 2009, 829-843, 15 Pages.

Aberle, "Surface passivation of crystalline silicon solar cells: a review," Progress Photovoltaics Research Applications 8, Iss. 5, 2000, 473-487, 15 Pages.

Sakai, et al. Effects of Surface-Morphology of Transparent Electrode on the Open-Circuit Voltage in A-Si-H Solar-Cells. Japanese Journal of Applied Physics 29, 1990, 630-635, 6 Pages.

Li, et al. "Structural defects caused by a rough substrate and their influence on the performance of hydrogenated nano-crystalline silicon n-i-p. solar cells," Solar Energy Materials & Solar Cells 93, 2009, 338-349, 12 Pages.

Sinencio, et al. "Barrier at the Interface between Amorphous-Silicon and Transparent Conducting Oxides and its Influence on Solar-Cell Performance," Journal of Applied Physics 54, Iss. 5, 1983, 2757-2760, 4 Pages.

Gassenbauer, et al. "Electronic and chemical properties of tin-doped indium oxide (ITO) surfaces and ITO/ZnPc interfaces studied in-situ by photoelectron spectroscopy," The Journal of Physical Chemistry B 110, 2006, 4793-4801, 9 Pages.

Rached, et al. "Influence of the front contact barrier height on the Indium Tin Oxide/hydrogenated p-doped amorphous silicon heterojunction solar cells," Thin Solid Films 516, 2008, 5087-5092, 6 Pages.

Cho, et al. "Molecular monolayers for conformal, nanoscale doping of InP nanopillar photovoltaics," Applied Physics Letters 98, 2011, 203101.

Lee, et al. "Roll-to-roll anodization and etching of aluminum foils for high-throughput surface nano-texturing," Nano Letters 11, 2011, 3425-3430, 12 Pages.

Wallentin, et al. "InP Nanowire Array Solar Cells Achieving 13.8% Efficiency by Exceeding the Ray Optics Limit," Science 339, Mar. 2013, 1057-1060, 5 Pages.

Smole, et al. "Computer model for simulation of amorphous silicon solar cell structures," Electrotechnical Conference, 1994, Proceedings 2, 7th Mediterranean, 621-624, 4 Pages.

Kanevce, et al. "The role of amorphous silicon and tunneling in heterojunction with intrinsic thin layer (HIT) solar cells," Journal of Applied Physics 105, Iss. 9, May 2009, p. 094507.

* cited by examiner

1500

| Nanopillar Pitch (nm) | Electrolyte | Voltage (V) | Temp. (°C) | Anodization time (hours) |
|---|---|---|---|---|
| 1000 | 1:1 (v:v) 4wt% Citric acid : Ethylene Glycol + 2.5mL 1wt% Phosphoric acid | 400 | 10 | 3 |
| 1200 | 1:1 (v:v) 2wt% Citric acid : Ethylene Glycol + 9mL 0.1wt% Phosphoric acid | 480 | 10 | Height 1151 nm: 6<br><br>Height 810 nm: 4<br><br>Height 614 nm: 3<br><br>Height 420: 0.5 |
| 1200 (Nanoconcave 200) | 1:1 (v:v) 2wt% Citric acid : Ethylene Glycol + 9mL 0.1wt% Phosphoric acid | 240 | 10 | 0.5 |
| 1500 | 1:1 (v:v) 1wt% Citric acid : Ethylene Glycol + 4mL 0.1wt% Phosphoric acid | 600 | 5 | 16 |
| 2000 | 1:1 (v:v) 0.1wt% Citric acid : Ethylene Glycol | 750 | 2 | 16 |

FIG. 15

ROLL-TO-ROLL FABRICATION OF ORDERED THREE-DIMENSIONAL NANOSTRUCTURE ARRAY, RELATED TECHNIQUES, MATERIALS AND PRODUCTS

CROSS REFERENCE TO RELATED APPLICATION

This application claims priority to U.S. Provisional Patent Application No. 61/853,144, filed on Mar. 29, 2013, and entitled "ROLL-TO-ROLL FABRICATION OF ORDERED THREE-DIMENSIONAL NANOSTRUCTURES ON FLEXIBLE ALUMINUM SUBSTRATES FOR EFFICIENT THIN FILM SOLAR CELLS," the entirety of which is hereby incorporated by reference.

TECHNICAL FIELD

The disclosed subject matter relates to nanostructure fabrication, e.g., to fabrication of ordered three-dimensional nanostructure arrays, and related techniques, materials and products.

BACKGROUND

Photovoltaic (PV) technologies have recently experienced renewed interest and corresponding technological advances, due in part to the fact that, among renewable energy technologies, PV technologies are considered to be one of the most promising as a result of their clean and environmental friendly nature and the abundance of solar energy. Conventional PV technologies typically include single crystalline silicon (c-Si) PV cells that are associated with high efficiency and stability. For example, state-of-art single crystalline silicon solar cells have power conversion efficiency of 25% and close to 20% for commercial solar panel applications. However single crystalline silicon solar cells have not replaced conventional fossil fuel energy sources due to the significantly higher cost and long energy payback time associated with single crystalline silicon solar cells. For instance, single crystalline silicon solar cells use bulk silicon wafer for active material for power generation, as well as being a supporting substrate of the entire solar cell.

However, most of the optical absorption of a typical solar cell takes place in the upper 30 micrometers ($\mu m$) surface. Accordingly, in an effort to substantially reduce the use of silicon material and associated cost of conventional silicon solar cells, thin film PV technologies have been explored. Thin film PV technologies typically use a thin layer of PV material to fabricate solar cells on a variety of substrates, which can be light weight and/or flexible, instead of using crystalline materials as the active material and supporting substrate. While research has been undertaken to improve materials and device structures of thin film PV devices in order to improve performance to a level comparable to that of crystalline solar cells, further improvements are necessary.

For instance, adding a surface texture to the front and/or the bottom surface of a PV device can be used to enhance light scattering and reduce surface reflection, in an effort to improve thin film PV device performance. As an example, nanostructures can be used to alter the optical properties of surfaces and device structures, for optical applications generally, and for PV technologies, in particular. For instance, three-dimensional (3-D) nanostructures, such as nanotubes, nanorods, nanopillars, nanocones, nanodomes, nanowires, and the like can be attractive in such applications, because 3-D nanostructures can increase the surface area relative to a planar surface of a substrate. Accordingly, the increased surface area of 3-D nanostructures, relative to the surface structure of a two-dimensional (2-D) textured substrates, can facilitate broadband light absorption and increase efficiency.

However, conventional methods of adding a surface texture and/or associated structures typically comprise fabrication methods using complicated and/or expensive processes where opportunities for cost reduction by achieving economies of scale are limited. For instance, conventional methods to fabricate 3-D nanostructures have typically focused on fabrication by vapor-liquid solid growth, photolithography, nanotransfer printing, and/or micromolding in capillaries. Thus, while the resulting 3-D nanostructures can be effective in the facilitation of broadband and efficient light trapping, such methods remain expensive and complicated, with poor controllability and scalability, thereby limiting the applicability of 3-D nanostructures in practical applications such as thin film PV technologies.

In one example, microstructures and/or nanostructures built on hard and/or rigid PV substrates such as silicon or silicon dioxide glass are not flexible, which limits their installation options and associated applications and market. Furthermore, such rigid substrate implementations typically involve batch processing, which processes are relatively expensive compared to continuous processing techniques, and which can limit the economies of scale available associated with batch processing. In another example, nanostructures (e.g., nanoconcave, nanopillar, nanocone, etc.) having 3-D structured solar cells fabricated on top of the nanostructures require special care regarding surface morphology and photon management to provide adequate performance improvements while maintaining low cost of thin film PV technologies relative conventional c-Si PV technologies. It is noted that, photon management capability of a nanostructure can depend on geometric factors, as well as material intrinsic optical properties. Accordingly, it is further noted that the ability to control geometries of nanostructures such as pitch, height, shape, etc., for example, can facilitate fabrication of optimal device structures. For instance, 3-D nanostructure such as nanopillars, nano-pyramids, etc., have been explored to improve efficiency of light trapping, but such structures are typically fabricated with the aforementioned expensive processes, where scalability is limited. As an example, structures fabricated by lithography and reactive ion etching (RIE) involve expensive equipment and associated support facilities, the maintenance of which is also expensive. Moreover, the scalability of such textured substrates, which also require batch processing, is limited by the chamber size and/or the capabilities of the process equipment, which combine to hinder the commercialization of the thin film PV technologies.

In addition, while conventional nanostructure fabrication techniques that result in non-ordered or self-ordered nanostructures can demonstrate improved photon capturing capability, such conventional nanostructure fabrication techniques can result in reductions in PV device performance for associated PV device structures. As a result, poor control of surface morphology afforded by conventional nanostructure fabrication techniques can result in reductions in PV device performance. For instance, fabrication of non-ordered (e.g., random or self-ordered) nanostructures can have irregular 3-D nanostructures (e.g., irregular morphology, pitch, spacing, ordering, etc.). As mentioned, such conventional non-ordered or self-ordered nanostructures can have improved photon capturing capability when implemented in associated PV device structures. However, irregularity on periodicity, height, etc. of non-ordered or self-ordered nanostructures can introduce large variations of coated film thickness for subsequent layers of a thin film PV device fabrication technique. Such variations can be detrimental for PV device performance, which devices can be sensitive to local variation of junction depth.

It is thus desired to provide techniques for the formation of predetermined or ordered 3-D nanostructures that improve upon these and other deficiencies. The above-described deficiencies of conventional nanostructure fabrication techniques are merely intended to provide an overview of some of the problems of conventional implementations, and are not intended to be exhaustive. Other problems with conventional implementations and techniques and corresponding benefits of the various non-limiting embodiments described herein may become further apparent upon review of the following description.

SUMMARY

The following presents a simplified summary of the specification to provide a basic understanding of some aspects of the specification. This summary is not an extensive overview of the specification. It is intended to neither identify key or critical elements of the specification nor delineate any scope particular to any embodiments of the specification, or any scope of the claims. Its sole purpose is to present some concepts of the specification in a simplified form as a prelude to the more detailed description that is presented later.

In various non-limiting embodiments of the disclosed subject matter, systems, devices, and/or methods for formation of predetermined or ordered 3-D nanostructures are provided. For instance, exemplary non-limiting implementations provide nanostructure fabrication techniques that can facilitate the formation of predetermined or ordered 3-D nanostructures on substrates. As a non-limiting example, various non-limiting implementations can facilitate nanoimprinting of a substrate, which implementations can comprise roll-to-roll nanoimprinting of the substrate. In further non-limiting examples, exemplary embodiments can facilitate anodization (e.g., high voltage anodization, etc.) of the nanoimprinted substrate to facilitate the production of 3-D nanostructures. In various non-limiting embodiments as described herein, the disclosed subject matter facilitates control and/or determination of one or more nanostructure parameters (e.g., one or more of structure morphology, pitch, height, depth, spacing, ordering, etc.) via control of process parameters.

Accordingly, various embodiments of the disclosed subject matter facilitate forming regular arrays of predetermined or ordered 3-D nanostructures. In one aspect, methods are provided that facilitate roll-to-roll fabrication of predetermined or ordered 3-D nanostructure arrays. For instance, the described methods can include imprinting a substrate with a 2-D pattern by rolling a cylindrical pattern comprising a 2-D array of structures against the substrate. In a further non-limiting aspect, the 2-D pattern can correspond to predetermined or ordered 3-D nanostructures to be formed on the substrate. In a further non-limiting aspect, exemplary methods can include anodizing and/or etching the imprinted substrate.

In other non-limiting implementations, exemplary methods can comprise fabricating a cylindrical pattern to facilitate roll-to-roll fabrication of predetermined or ordered 3-D nanostructures arrays. In yet other embodiments of the disclosed subject matter, articles of manufacture are described. For instance, exemplary articles of manufacture can comprise a substrate imprinted with a 2-D pattern that can correspond to a 2-D array of structures of a pattern applied to the substrate, and wherein the 2-D array of structures can correspond to an ordered array of 3-D nanostructures to be formed on the substrate. In a further aspect, exemplary articles of manufacture can further comprise the ordered array of 3-D nanostructures and/or one or more layer(s) formed over the ordered array of 3-D nanostructures.

These and other embodiments are described in more detail below.

BRIEF DESCRIPTION OF THE DRAWINGS

Various non-limiting embodiments are further described with reference to the accompanying drawings in which:

FIG. 15 tabulates various non-limiting examples of process parameters related to anodization of an imprinted substrate, according to further non-limiting embodiments;

DETAILED DESCRIPTION

Overview

Figure 1:
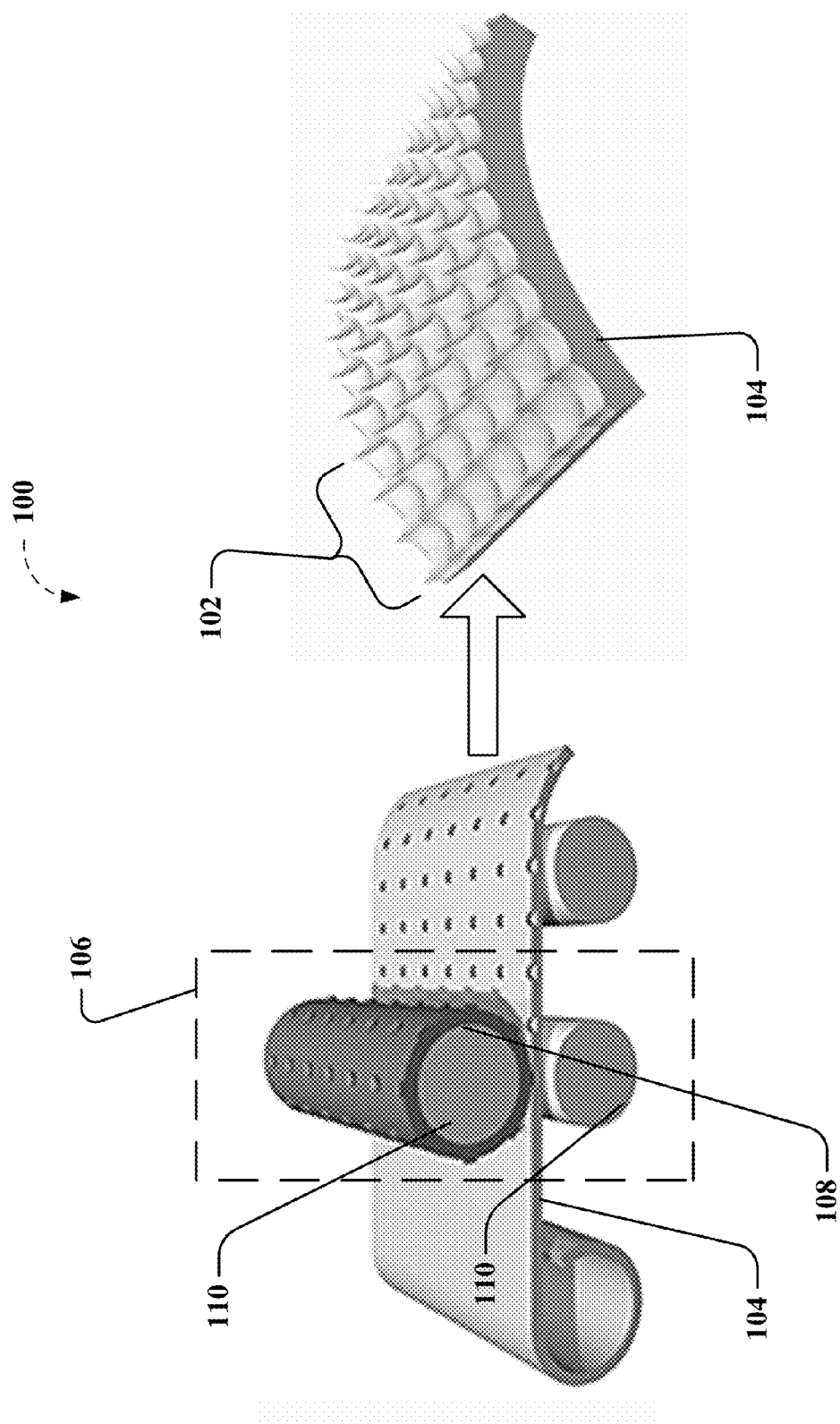
FIG. 1 depicts a non-limiting schematic diagram of the formation of predetermined or ordered 3-D nanostructures, according to various non-limiting aspects of the disclosed subject matter.

While a brief overview is provided, certain aspects of the disclosed subject matter are described or depicted herein for the purposes of illustration and not limitation. Thus, variations of the disclosed embodiments as suggested by the disclosed apparatuses, systems and methodologies are intended to be encompassed within the scope of the subject matter disclosed herein. For example, the various embodiments of the apparatuses, techniques and methods of the disclosed subject matter are described in the context of efficient and inexpensive nanostructure fabrication. However, as further detailed below, various exemplary implementations can be applied to other areas of nanostructure fabrication, without departing from the subject matter described herein.

As used herein, the terms, "nanostructures" "3-D nanostructures," and the like, refer to structures having a dimension of interest on the order of nanometers. As such, depending on context, the term, "nanostructures," can encompass any of a number of structures having a dimension of interest on the order of nanometers. For instance, depending on context, the term, "nanostructures," can include one or more of nanoconcaves, nanodomes, nanorods, nanopillars, nanospikes, nanocones, nanotubes, and/or nanowires, and so on. In addition, as used herein, the terms, "ordered" and/or "predetermined," for example, in reference to "nanostructures," "arrays of nanostructures," and so on, are intended to connote a measure of control over one or more aspects or parameters of one or more nanostructures (e.g., one or more of nanostructure morphology, pitch, height, depth, spacing, ordering, etc.), formed or to be formed on a substrate, depending on context. For instance, as contrasted with conventional non-ordered or self-ordered nanostructures, which can comprise nanostructures for which measurements of aspects or parameters of self-ordered nanostructures are somewhat random or distributed (e.g., random spacing, uncontrolled ordering, uncontrolled morphology, large statistical variations in height, depth, pitch, and so on, etc.), "ordered" and/or "predetermined," nanostructures are intended to comprise nanostructures for which measurements of aspects or parameters of the nanostructures exhibit various measures of control of one or more of nanostructure morphology, pitch, height, depth, spacing, ordering, etc. Likewise, the term, "regular," in reference to a "regular array," for instance, is intended to refer to two or more of an object arranged in or constituting a constant or definite pattern, as opposed to being characterized by no definite pattern, characteristic of conventional non-ordered or self-ordered nanostructures.

As described in the background, due to the inherently low light absorption capability and typically low crystalline quality of conventional thin film PV devices, improvements in materials and device structures for thin film PV devices are sought to improve performance to a level comparable to that of crystalline solar cells. Accordingly, conventional approaches to improve performance of PV devices introduce light trapping schemes to harvest incoming photons more efficiently, which can be realized by texturizing front and/or bottom surfaces of the solar cell device to enhance light scattering and reduce surface reflection. In particular, to produce antireflection (AR) coatings with nanostructure arrays comprising nanostructures, such as nanoconcaves, nanopillars, nanocones, etc., for example, such nanostructures can be fabricated with 3-D structured solar cells fabricated on top of these nanostructures to realize cost reductions and performance improvements.

For instance, PV designs based on 3-D nanostructures or microstructures, can include structures such as nanotubes, nanocoax, nanorods (or nanopillars), nanocones, nanodomes, nanowires, and so on. Such structures can provide unique advantages in terms of strong light absorption and efficient charge separation owing to their large surface areas and 3-D structures. In this regard, various top-down and bottom-up methods have been developed to build 3-D structures, such as vapor-liquid-solid (VLS) growth, photolithography, nanotransfer printing (nTP), micromolding in capillaries (MIMIC), etc. However, as described, these conventional methods of fabricating nanostructure arrays as AR structures are typically implemented by either expensive or complicated top down fabrication methods, or implemented by bottom-up fabrication methods with poor process control of structure parameters (e.g., one or more of structure morphology, pitch, height, depth, spacing, ordering, etc.).

Thus, while 3-D solar cells can be achieved by coating thin film photovoltaic materials on 3-D AR structures, conventional fabrication methods typically comprise complicated and/or expensive processes where opportunities for cost reduction by achieving economies of scale are limited. In addition, irregularity on periodicity, height, etc. of non-ordered (e.g., random or self-ordered) nanostructures can introduce large variations of coated film thickness for subsequent layers of a thin film PV device fabrication technique. Such variations can be detrimental for PV device performance, which devices can be sensitive to local variation of junction depth. For instance, while various 3-D nanostructures can be observed to improve light absorption in PV device active material, with effectiveness monotonically depending on aspect ratio, high aspect ratio 3-D nanostructures can compromise uniformity of an amorphous silicon (a-Si) coating on the 3-D nanostructures, which can adversely affect building potential in the thin film and, in turn, negatively affect carrier collection.

Thus, competition between light absorption and carrier collection in conventional planar thin film solar cells presents unique design challenges in the effort to improve PV device performance. Accordingly, light management schemes, such as photonic and/or plasmonic light trapping, can be used in conjunction with unique device designs to improve minority carrier collection efficiency. Although a number of conventional nanostructures, such as nanodome, nanocoax, nanorod and nanopillars, etc., provide some measure of understanding on how morphological and structural changes affect trade-offs between photon absorption and carrier collection in a thin film solar cell device, a lack of fundamental understanding of how morphological and structural changes affect such trade-offs exists due, in part, to the inability to adequately control structure parameters (e.g., one or more of structure morphology, pitch, height, depth, spacing, ordering, etc.), in addition to the lack of cost-effective and/or scalable schemes to fabricate desired nanostructures on flexible substrates.

Various aspects or features of the disclosed subject matter are described with reference to the drawings, wherein like reference numerals are used to refer to like elements throughout. In this specification, numerous specific details are set forth in order to provide a thorough understanding of the disclosed subject matter. It should be understood, however, that the certain aspects of disclosure may be practiced without these specific details, or with other methods, components, parameters, chemical compositions, etc. In other instances, well-known structures and devices are shown in block diagram form to facilitate description and illustration of the various embodiments. In accordance with one or more embodiments described in disclosed subject matter, described herein are predetermined or ordered 3-D nanostructure arrays formed on a substrate according to low-cost and highly scalable fabrication techniques.

Accordingly, FIG. 1 depicts a non-limiting schematic diagram 100 of the formation of predetermined or ordered 3-D nanostructures 102, according to various non-limiting aspects of the disclosed subject matter. As described above, the disclosed subject matter provides systems, devices, and/or methods for formation of predetermined or ordered 3-D nanostructures 102. For instance, exemplary non-limiting implementations provide nanostructure fabrication techniques that can facilitate the formation of predetermined or ordered 3-D nanostructures 102 on substrates 104. As a non-limiting example, various non-limiting implementations can facilitate nanoimprinting 106 of a substrate 104, which implementations can comprise roll-to-roll nanoimprinting 106 of the substrate 104 with a master pattern 108 (e.g., comprising a two-dimensional (2-D) array of structures). For instance, master pattern 108 can be mounted on a roller system comprising two parallel cylinder rollers 110 as depicted in FIG. 1. In addition, the disclosed subject matter facilitates control and/or determination of one or more nanostructure parameters (e.g., one or more of structure morphology, pitch, height, depth, spacing, ordering, etc.) via control of process parameters. Accordingly, PV devices with special care on surface morphology and photon management are facilitated, which can provide improved performance, while controlling associated costs compared to, for example, conventional c-Si PV devices. For example, by providing techniques compatible with roll-to-roll processing (e.g., roll-to-roll nanoimprinting 106), the disclosed subject matter facilitates low-cost and scalable formation of predetermined or ordered 3-D nanostructures 102.

As further described herein, the disclosed subject matter can facilitate the formation of predetermined or ordered 3-D nanostructures 102 on substrates 104. In other non-limiting aspects, FIG. 1 can facilitate large scale roll-to-roll nanoimprinting 106 to facilitate formation of predetermined or ordered 3-D nanostructures 102 on a substrate 104 comprising a flexible aluminum (Al) foil. In a particular non-limiting example, the disclosed subject matter facilitates formation of predetermined or ordered 3-D nanostructures 102 comprising a 3-D Al nanopillar array. As further described herein, imprinted substrate 104 can be further anodized and etched to facilitate large scale fabrication of regular arrays of predetermined or ordered 3-D nanostructures 102 on flexible substrates 104.

In various non-limiting aspects, by combining roll-to-roll nanoimprinting process with an anodization process, the disclosed subject matter facilitates production of flexible substrates 104 on a large scale, thus providing the potential for performance improvements, as well as cost reductions, compared to conventional thin film PV devices. As a non-limiting example, the described nanoimprinting 106 processes (e.g., roll-to-roll nanoimprinting process, etc.) can facilitate high substrate 104 throughput, which, in conjunction with provided anodization processes, can also facilitate control and/or determination of one or more nanostructure parameters (e.g., one or more of structure morphology, pitch, height, depth, spacing, ordering, etc.) via control of process parameters, while maintaining low cost and scalability for mass production of flexible thin film PV devices on predetermined or ordered 3-D nanostructures 102.

Figure 2:
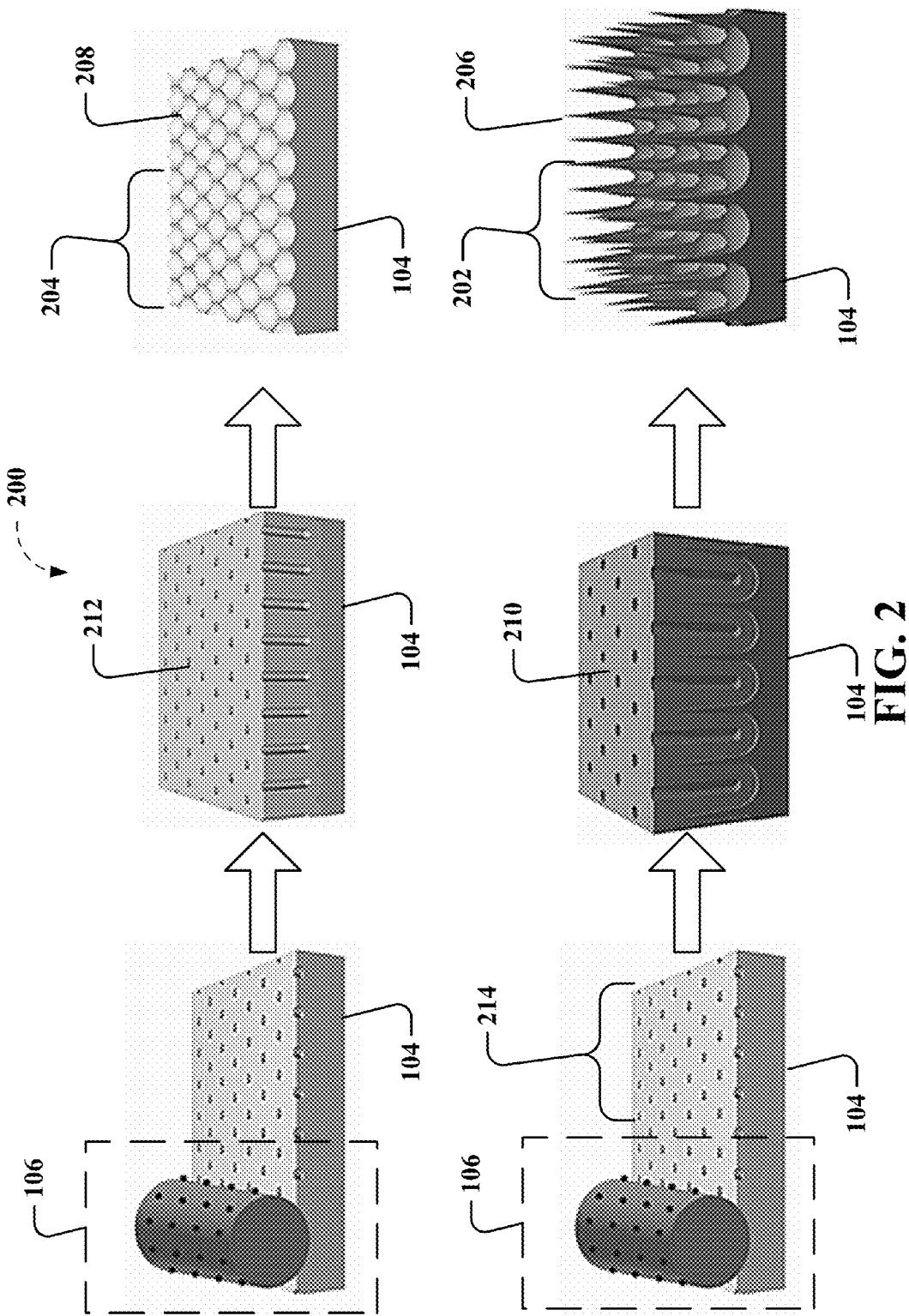
FIG. 2 depicts further non-limiting schematic diagrams of the formation of predetermined or ordered 3-D nanostructures, according to further non-limiting aspects.

For instance, FIG. 2 depicts further non-limiting schematic diagrams 200 of the formation of predetermined or ordered 3-D nanostructures 102, according to further non-limiting aspects. For instance, as further described herein, in contrast to conventional fabrication techniques, control and/or determination of one or more nanostructure parameters (e.g., one or more of structure morphology, pitch, height, depth, spacing, ordering, etc.) of predetermined or ordered 3-D nanostructures 102 is provided. As a non-limiting example, various embodiments of the disclosed subject matter can facilitate formation of 3-D nanostructures 102 that are square-ordered 202, hexagonally-ordered 204, and so on.

In further non-limiting examples, the disclosed subject matter can facilitate formation of 3-D nanostructures 102 comprising one or more of nanopillars 206, nanoconcaves 208, etc. In particular non-limiting embodiments, the disclosed subject matter facilitates formation of predetermined or ordered 3-D nanostructures 102 on a substrate 104 comprising a metallic foil. As a further non-limiting example, the disclosed subject matter can facilitate formation of predetermined or ordered 3-D nanostructures 102 on a substrate 104 comprising Al, anodized Al, Al oxide or Alumina (e.g., $Al_2O_3$), etc., whether as a metallic foil, metallic substance deposited a substrate 104, or otherwise, etc. For instance, FIG. 2 demonstrates a hexagonally-ordered 204 pattern on substrate 104 achieved after anodization forms porous anodic aluminum oxide (AAO) 212 on an Al foil substrate 104 (e.g., hexagonally-ordered 204 nanoconcave 208 array) after etching away AAO 212 on the Al foil substrate 104, according to various non-limiting aspects. In further non-limiting aspects, FIG. 2 also demonstrates a square-ordered 202 pattern on substrate 104 after anodization forms porous AAO 210 on the Al foil substrate 104 (e.g., square-ordered 202 nanopillar 206 array) after etching away AAO 210 on the Al foil substrate 104.

In yet other non-limiting aspects, control of other nanostructure parameters can be employed according to various aspects as described herein, for example, by controlling process parameters, as further described below regarding FIGS. 8, 12-16, etc. As a non-limiting example, variations in the master pattern 108 can be controlled as described herein, for example, by adjusting ordering, pitch, and/or spacing, etc. of the 2-D array of structures on the master pattern 108, as further described regarding FIGS. 8, 12-13, etc. In a further non-limiting example, depth of the nanoconcaves 208, height of the nanopillars 206, and so on can be controlled, for example, by adjusting anodization time, which affects AAO layer 210 or 212 formed on a patterned Al substrate 104, for instance, as further described regarding FIGS. 14-15.

While, for the purposes of illustration, and not limitation, various non-limiting implementations of the disclosed subject matter are described herein in reference to Al, an Al substrate 104, an Al foil substrate 104, and so on, it can be understood that variations of the disclosed subject matter are possible within the scope of claims appended to the subject matter disclosed herein. For instance, it can be understood that other substrates 104 (e.g., a metallic foil, a metallic substance deposited on a substrate 104, other flexible substrates, etc.), ordering, patterns, spacing, pitch, and so on can be employed or be desirable in conjunction with the disclosed subject matter, depending on, for instance, design considerations, etc.

In contrast to conventional textured substrates fabricated by lithography, it can be understood that the nanoimprinting 106 and anodization processes as described herein are highly scalable using relatively inexpensive equipment. In addition, light weight and flexible substrates 104 (e.g., an Al substrate 104), upon which predetermined or ordered 3-D nanostructures 102 can be formed, can provide attractive alternatives to conventional thin film PV silicon or silicon dioxide devices fabricated upon rigid and brittle substrates.

Accordingly, in particular non-limiting implementations, the disclosed subject matter provides a facile and highly scalable process to fabricate predetermined or ordered 3-D nanostructures 102 on aluminum Al foil substrates 104, which can provide thin and flexible substrates 104 suitable for thin film PV devices. According to various non-limiting aspects, forming predetermined or ordered 3-D nanostructures 102 can be facilitated by roll-to-roll imprinting 106 a 2-D pattern 214 on to substrate 104 (e.g., such as a thin Al foil, etc.). According to further non-limiting aspects, forming predetermined or ordered 3-D nanostructures 102 can be facilitated by anodization (e.g., electrochemical anodization in an acidic solution, etc.).

Thus, regular arrays of predetermined or ordered 3-D nanostructures 102 can be fabricated on flexible aluminum foil with a roll-to-roll compatible process, in accordance with various aspects of the disclosed subject matter. The predetermined or ordered 3-D nanostructures 102 can have precisely controlled geometry and periodicity, as described herein, which allow systematic investigation on geometry dependent optical and electrical performance of associated thin-film PV devices, as well as uniformity in film thickness for subsequent layers of a thin film PV device fabrication technique, and integrated design and fabrication of associated thin film PV devices.

In view of the subject matter described supra, methods that can be implemented in accordance with the disclosed subject matter will be better appreciated with reference to the flowcharts of FIGS. 3-7. While for purposes of simplicity of explanation, the methods are shown and described as a series of blocks, it is to be understood and appreciated that such illustrations or corresponding descriptions are not limited by the order of the blocks, as some blocks may occur in different orders and/or concurrently with other blocks from what is depicted and described herein. Any non-sequential, or branched, flow illustrated via a flowchart should be understood to indicate that various other branches, flow paths, and orders of the blocks, can be implemented which achieve the same or a similar result. Moreover, not all illustrated blocks may be required to implement the methods described hereinafter.

Exemplary Methods

Figure 3:
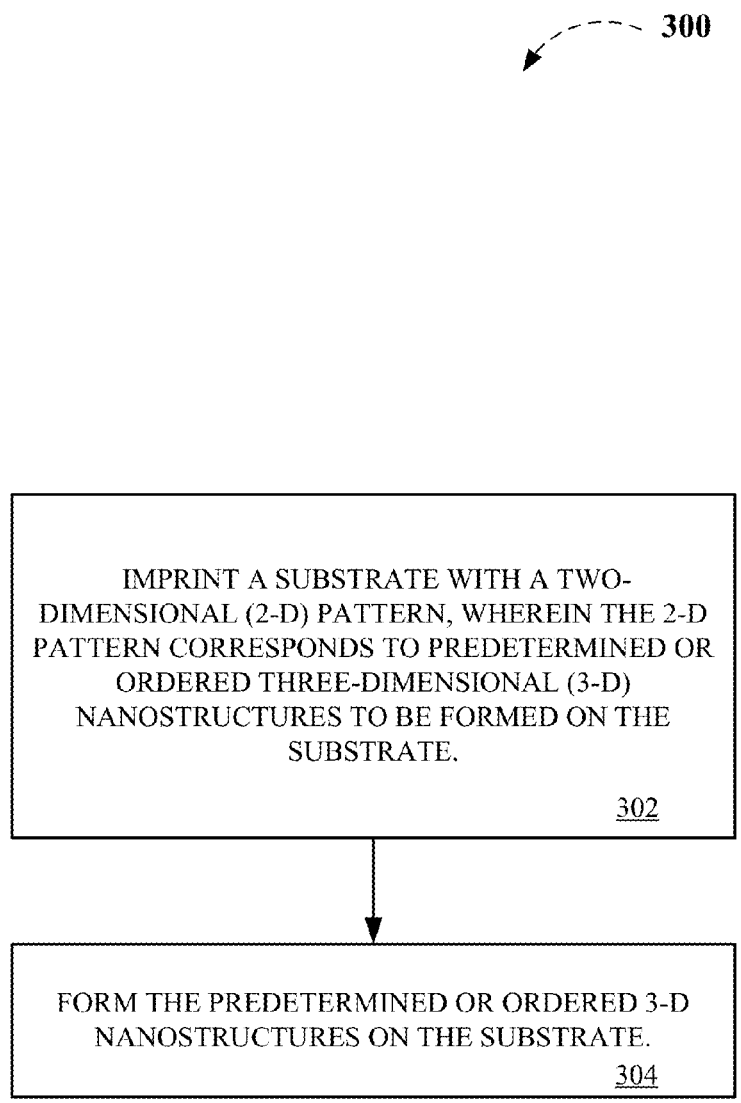
FIG. 3 depicts an exemplary flowchart of non-limiting methods for formation of predetermined or ordered 3-D nanostructures.

FIG. 3 depicts an exemplary flowchart of non-limiting methods 300 for formation of predetermined or ordered 3-D nanostructures 102 (e.g., nanopillars 206, nanoconcaves 208, etc.). As can be understood, variations in the exemplary methods known to one having ordinary skill in the art may be possible without deviating from the intended scope of the subject matter as claimed.

Accordingly, various non-limiting implementations of exemplary methods 300, as described herein, can comprise imprinting a substrate 104 with a 2-D pattern (e.g., pattern 214), at 302. In a non-limiting aspect, the 2-D pattern (e.g., pattern 214) can correspond to predetermined or ordered 3-D nanostructures 102 (e.g., nanopillars 206, nanoconcaves 208, etc.) to be formed on the substrate 104 (e.g., a metallic foil substrate 104, an aluminum foil substrate 104, a metallic substance deposited on the substrate 104, etc.). In a further non-limiting aspect, methods 300 can comprise imprinting substrate 104 with one or more of a square-ordered 2-D pattern (e.g., pattern 214) or a hexagonal-ordered 2-D pattern (e.g., pattern 214) that corresponds to one or more of 3-D nanopillars or 3-D nanoconcaves (e.g., one or more of nanopillars 206, nanoconcaves 208, etc.) to be formed on the substrate 104. In yet another non-limiting aspect, methods 310 can comprise rolling a cylindrical pattern comprising a 2-D array of structures against the substrate 104 (e.g., roll-to-roll nanoimprinting 106, etc.), such as applying a master pattern 108 comprising a 2-D array of structures) against substrate 104. For instance, methods 300 can also comprise rolling the cylindrical pattern comprising the 2-D array of structures of a predetermined pitch, wherein the 2-D pattern (e.g., pattern 214) can correspond to a predetermined spacing of the predetermined or ordered 3-D nanostructures 102 (e.g., nanopillars 206, nanoconcaves 208, etc.) to be formed on the substrate 104.

In further non-limiting implementations of methods 300, at 304, methods 300 can further comprise forming the predetermined or ordered 3-D nanostructures 102 (e.g., nanopillars 206, nanoconcaves 208, etc.) on the substrate 104, for example, as further described herein. For instance, in non-limiting embodiments, methods 300 can comprise forming one or more of a square-ordered array (e.g., a square ordered array of nanopillars 206) or a hexagonal-ordered array (e.g., a hexagonal ordered array of nanoconcaves 208), as further described herein. As a further non-limiting example, methods 300 can comprise one or more of anodizing substrate 104 and/or etching the anodized substrate 104, for instance, as further described herein.

Figure 4:
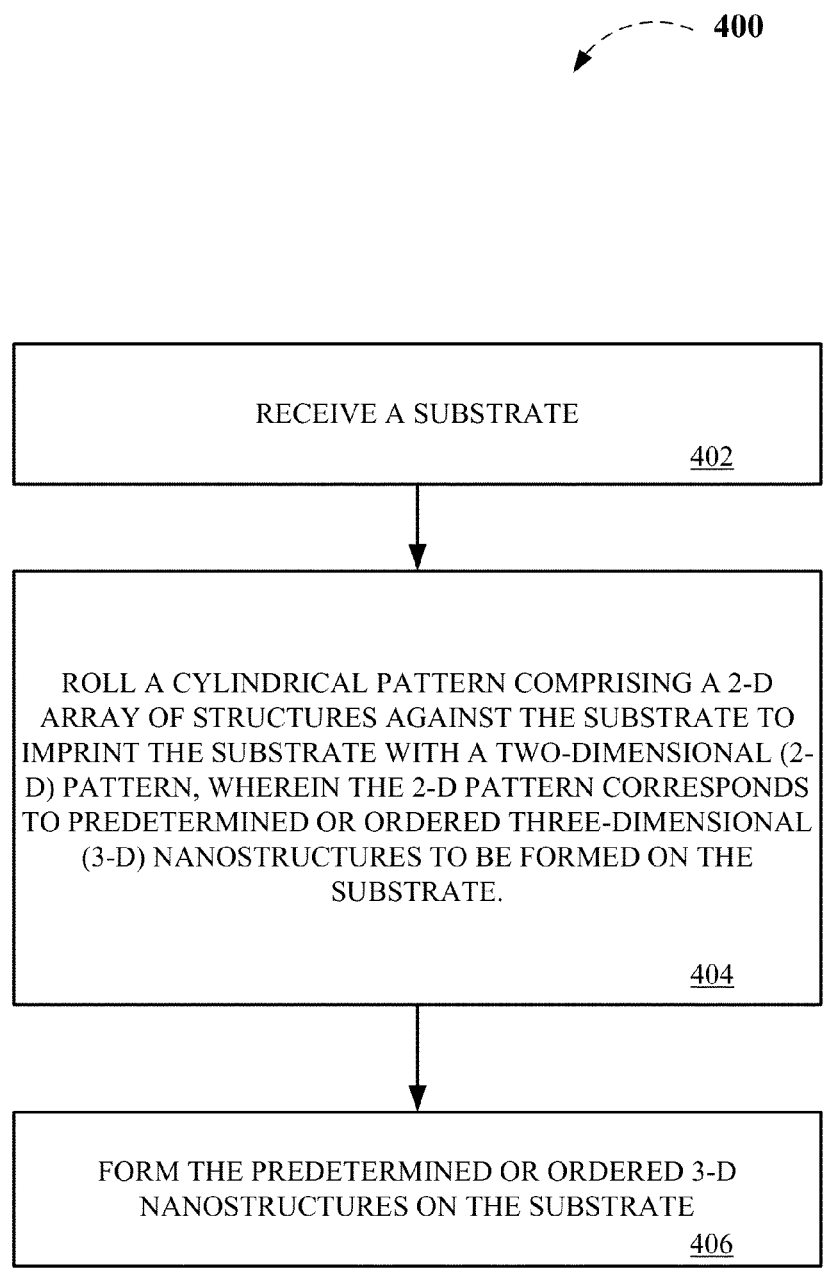
FIG. 4 depicts a non-limiting flowchart of exemplary methods that facilitate formation of predetermined or ordered 3-D nanostructures, according to further non-limiting embodiments.

For instance, FIG. 4 depicts a non-limiting flowchart of exemplary methods 400 that facilitate formation of predetermined or ordered 3-D nanostructures 102 (e.g., nanopillars 206, nanoconcaves 208, etc.), according to further non-limiting embodiments. As a non-limiting example, exemplary methods 100 can comprise receiving a substrate 104 (e.g., a metallic foil substrate 104, an aluminum foil substrate 104, a metallic substance deposited on the substrate 104, etc.), at 402.

At 404, a cylindrical pattern comprising a 2-D array of structures (e.g., such as a nanoimprint master pattern 108 comprising a 2-D array of structures) can be rolled against the substrate 104 (e.g., roll-to-roll nanoimprinting 106, etc.) to imprint the substrate 104 with a 2-D pattern (e.g., pattern 214), according to further non-limiting aspects of exemplary methods 400. In a further non-limiting aspect, methods 400 can comprise imprinting substrate 104 with one or more of a square-ordered 2-D pattern (e.g., pattern 214) or a hexagonal-ordered 2-D pattern (e.g., pattern 214) that corresponds to one or more of 3-D nanopillars or 3-D nanoconcaves (e.g., one or more of nanopillars 206, nanoconcaves 208, etc.) to be formed on the substrate 104. For instance, as described above, methods 400 can also comprise rolling the cylindrical pattern comprising the 2-D array of structures of a predetermined pitch, wherein the 2-D pattern (e.g., pattern 214) can correspond to a predetermined spacing of the predetermined or ordered 3-D nanostructures 102 (e.g., nanopillars 206, nanoconcaves 208, etc.) to be formed on the substrate 104. Thus, in another non-limiting aspect, 2-D pattern (e.g., pattern 214) can correspond to predetermined or ordered 3-D nanostructures 102 (e.g., nanopillars 206, nanoconcaves 208, etc.) formed or to be formed on the substrate 104.

For still other exemplary implementations of methods 400, at 406, methods 400 can further comprise forming the predetermined or ordered 3-D nanostructures 102 (e.g., nanopillars 206, nanoconcaves 208, etc.) on the substrate 104, for example, as described above. For instance, in non-limiting embodiments, methods 400 can comprise forming one or more of a square-ordered array (e.g., a square ordered array of nanopillars 206) or a hexagonal-ordered array (e.g., a hexagonal ordered array of nanoconcaves 208), as further described herein. As a further non-limiting example, methods 400 can comprise one or more of anodizing substrate 104 and/or etching the anodized substrate 104, for instance, as further described herein.

Figure 5:
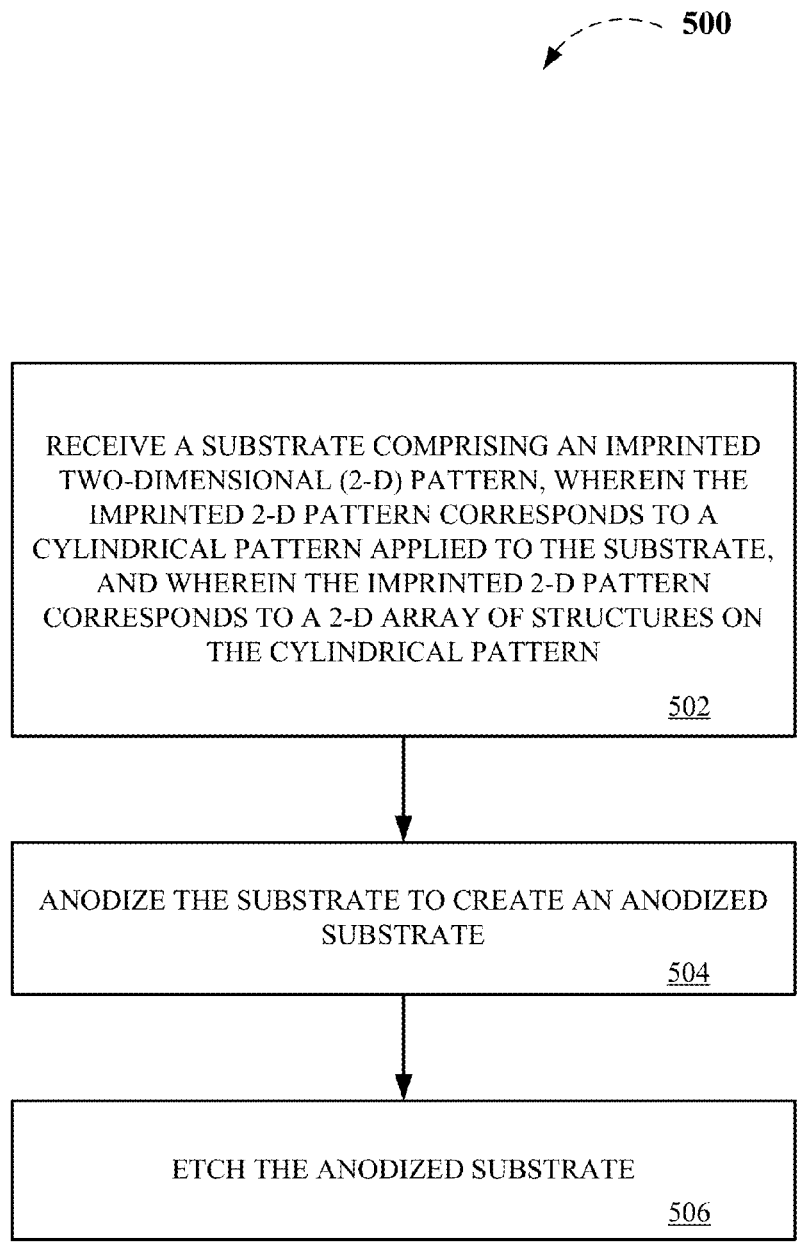
FIG. 5 depicts another non-limiting flowchart of non-limiting methods that facilitate formation of predetermined or ordered 3-D nanostructures, according to further non-limiting aspects.

FIG. 5 depicts another non-limiting flowchart of non-limiting methods 500 that facilitate formation of predetermined or ordered 3-D nanostructures 102 (e.g., nanopillars 206, nanoconcaves 208, etc.), according to further non-limiting aspects. For instance, exemplary implementations of methods 500 can comprise receiving a substrate 104 (e.g., a metallic foil substrate 104, an aluminum foil substrate 104, a metallic substance deposited on the substrate 104, etc.) comprising an imprinted 2-D pattern (e.g., pattern 214). In a non-limiting aspect of methods 500, the imprinted 2-D pattern (e.g., pattern 214) can correspond to a cylindrical pattern (e.g., such as a nanoimprint master pattern 108 comprising a 2-D array of structures) applied to the substrate 104, as described herein. In yet another non-limiting aspect, the methods 500, the imprinted 2-D pattern (e.g., pattern 214) can also correspond to a 2-D array of structures on the cylindrical pattern (e.g., such as via application of a nanoimprint master pattern 108), for example, as further described herein.

According to various non-limiting embodiments, methods 500 can comprise forming predetermined or ordered 3-D nanostructures 102 (e.g., nanopillars 206, nanoconcaves 208, etc.) on the substrate 104. In a non-limiting aspect, predetermined or ordered 3-D nanostructures 102 (e.g., nanopillars 206, nanoconcaves 208, etc.) formed according to methods 500 can correspond to the imprinted 2-D pattern (e.g., pattern 214) on the substrate 104. For instance, in non-limiting embodiments, methods 500 can comprise forming one or more of a square-ordered array (e.g., a square ordered array of nanopillars 206) or a hexagonal-ordered array (e.g., a hexagonal ordered array of nanoconcaves 208), as further described herein. In another non-limiting aspect, methods 500 can facilitate forming predetermined or ordered 3-D nanostructures 102 (e.g., nanopillars 206, nanoconcaves 208, etc.) of between about 500 nm to about 2.5 µm. In yet another non-limiting example, methods 500 can comprise one or more of anodizing substrate 104 and/or etching the anodized substrate 104, for instance, as further described herein.

For instance, at 504, further non-limiting implementations of methods 500 can comprise anodizing the substrate 104 to create an anodized substrate, as further described herein. For instance, methods 500 can comprise anodizing substrate 104 in a mixture of citric acid, phosphoric acid, ethylene glycol, and/or deionized water, as a non-limiting example, as further described herein, for example, regarding FIG. 15. In another non-limiting aspect, methods 500 can comprise anodizing substrate 104 with a direct current voltage comprising a value between about 200 V to about 750 V.

In addition, at 506, exemplary methods 500 can further include etching the anodized substrate, for example, as described herein. For instance, methods 500 can comprise etching the anodized substrate with an acidic solution, in a non-limiting aspect, as further described herein.

Figure 6:
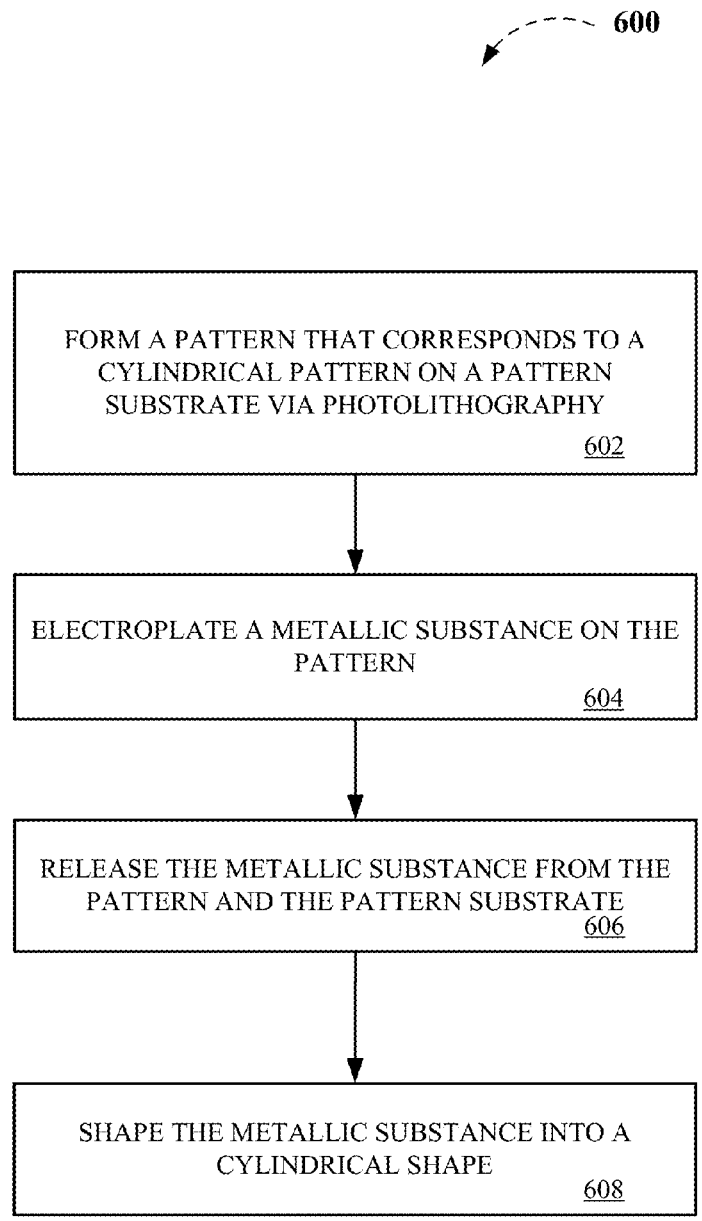
FIG. 6 depicts an exemplary flowchart of non-limiting methods for fabrication of a master pattern that facilitates formation of predetermined or ordered 3-D nanostructures, according to various non-limiting embodiments.

FIG. 6 depicts an exemplary flowchart of non-limiting methods 600 for fabrication of a master pattern (e.g., master pattern 108 comprising a 2-D array of structures) that facilitates formation of predetermined or ordered 3-D nanostructures 102 (e.g., nanopillars 206, nanoconcaves 208, etc.), according to various non-limiting embodiments. As a non-limiting example, methods 600 can comprise forming a pattern (e.g., pattern substrate 806 with pattern 808), which can correspond to a cylindrical pattern (e.g., such as a nanoimprint master pattern 108 comprising a 2-D array of structures) on a pattern substrate (e.g., such as a Si wafer 806), via photolithography, at 602, as further described herein, regarding FIG. 8, for instance.

In a non-limiting aspect, methods 600 can comprise electroplating a metallic substance (e.g., one or more of metallic substances 810, 812, etc.) on the pattern, at 604, and releasing the metallic substance from the pattern and the pattern substrate (e.g., pattern substrate 806 with pattern 808), at 606. In further non-limiting aspects, at 608, exemplary methods 600 can comprise shaping the metallic substance (e.g., one or more of metallic substances 810, 812, etc.) into a cylindrical shape, to facilitate forming a nanoimprint master pattern 108, for example, as described herein.

Figure 7:
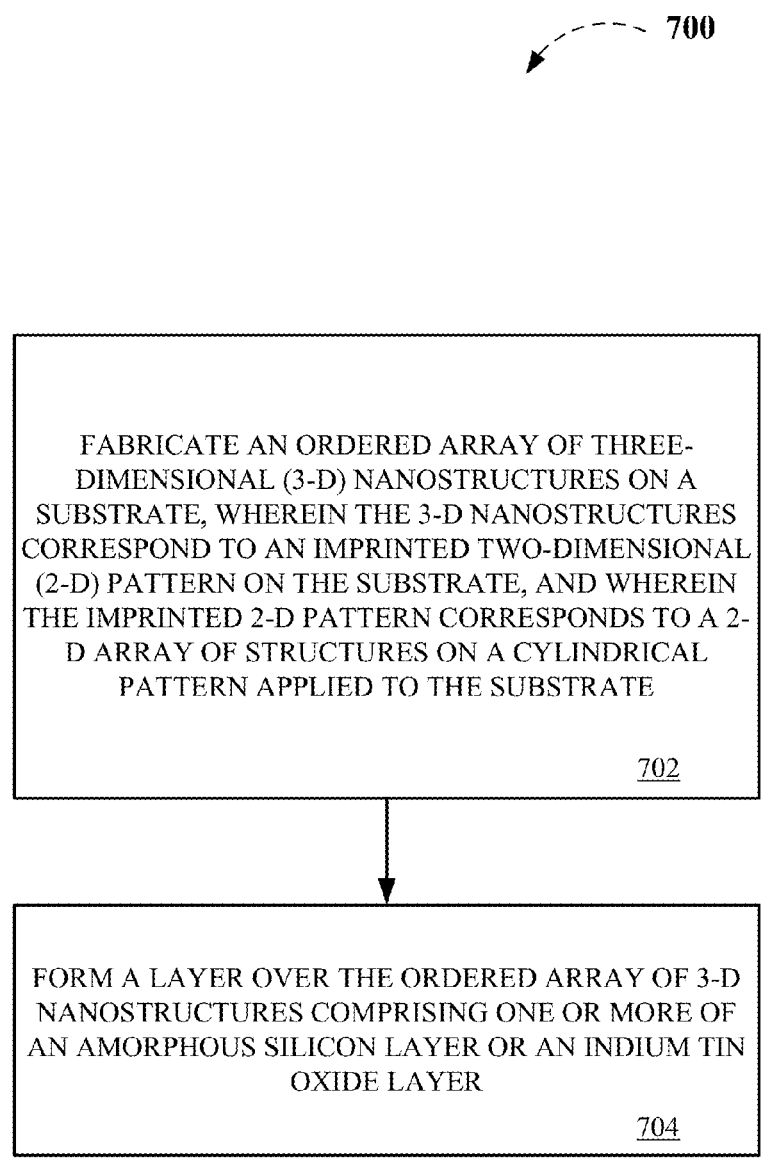
FIG. 7 depicts another non-limiting flowchart of exemplary methods that facilitate fabrication of PV devices on 3-D nanostructures, according to further non-limiting aspects.

FIG. 7 depicts another non-limiting flowchart of exemplary methods 700 that facilitate fabrication of PV devices on 3-D nanostructures 102 (e.g., nanopillars 206, nanoconcaves 208, etc.), according to further non-limiting aspects. For example, exemplary limitations of methods 700 can comprise fabricating an ordered array of 3-D nanostructures 102 (e.g., nanopillars 206, nanoconcaves 208, etc.) on a substrate 104 (e.g., a metallic foil substrate 104, an aluminum foil substrate 104, a metallic substance deposited on the substrate 104, etc.), at 702, as described herein, for instance, regarding FIG. 3-6. In a non-limiting aspect of exemplary method 700, the 3-D nanostructures 102 (e.g., nanopillars 206, nanoconcaves 208, etc.) can correspond to an imprinted 2-D pattern (e.g., pattern 214) on the substrate 104, as further described herein. In yet another non-limiting aspect of exemplary methods 700, the imprinted 2-D pattern (e.g., pattern 214) can correspond to a 2-D array of structures on a cylindrical pattern (e.g., such as a nanoimprint master pattern 108 comprising a 2-D array of structures) applied to the substrate 104. In another non-limiting aspect, methods 700 can comprise configuring or selecting one or more of a pitch or an ordering of the 2-D array of structures (e.g., such as via application of a nanoimprint master pattern 108 comprising the 2-D array of structures) to determine one or more of a spacing or a morphology of the 3-D nanostructures 102 (e.g., nanopillars 206, nanoconcaves 208, etc.), as further described herein.

In yet another non-limiting example, methods 700 can comprise one or more of anodizing substrate 104 and/or etching the anodized substrate 104, for instance, as further described herein. For instance, at 702, further non-limiting implementations of methods 700 can comprise anodizing the substrate 104 to create an anodized substrate, as further described herein. For instance, methods 700 can comprise anodizing substrate 104 in a mixture of citric acid, phosphoric acid, ethylene glycol, and/or deionized water, as a non-limiting example, as further described herein, for example, regarding FIG. 15. In another non-limiting aspect, methods 700 can comprise anodizing substrate 104 with a direct current voltage comprising a value between about 200 V to about 750 V.

In still other non-limiting implementations of methods 700, methods 700 can comprise forming one or more layer(s) (e.g., one or more of layer(s) 1002, 1004, 1006, 1008, and/or 1010, etc.) over the ordered array (e.g., a square ordered array, a hexagonal-ordered array, etc.) of 3-D nanostructures 102 (e.g., nanopillars 206, nanoconcaves 208, etc.), at 704, for example, as further described herein. In yet another aspect exemplary methods 700, forming one or more layer(s) over the ordered array of 3-D nanostructures 102 (e.g., nanopillars 206, nanoconcaves 208, etc.) can also comprise forming one or more of an amorphous silicon layer, an indium tin oxide layer, and/or other thin film PV materials, or materials associated therewith, including, but not limited to, cadmium/tellurium (Cd/Te) materials, and/or copper (indium/gallium) selenium (Cu(In,Ga)Se) PV materials, and/or any of a number of conventional insulation, passivation, isolation, contact and/or packaging layers or materials etc., to facilitate fabrication of high performance flexible thin film PV devices on an ordered array of 3-D nanostructures 102 (e.g., a nanopillar 206 array, a nanoconcave 208 array, etc.), as further described herein.

Exemplary Embodiments

Figure 8:
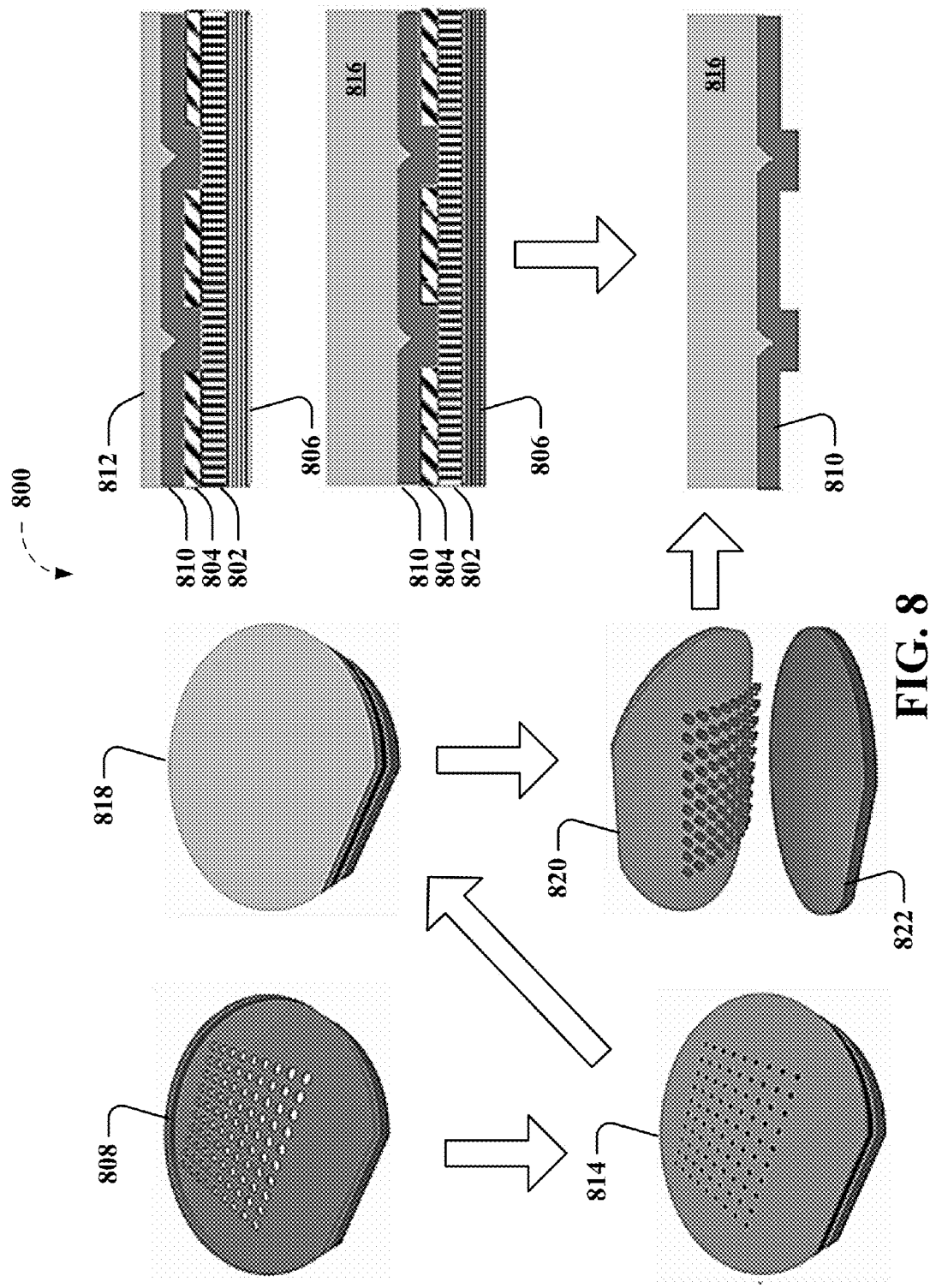
FIG. 8 depicts a non-limiting schematic diagram of the formation of a master pattern that facilitates the fabrication of predetermined or ordered 3-D nanostructures, according to various non-limiting aspects.

FIG. 8 depicts a non-limiting schematic diagram 800 of the formation of a master pattern 108 (e.g., a 2-D array of structures) that facilitates the fabrication of regular arrays of predetermined or ordered 3-D nanostructures 102 (e.g., nanopillars 206, nanoconcaves 208, etc.) on substrates 104, according to various non-limiting aspects. In various exemplary implementations, pitch of the predetermined or ordered 3-D nanostructures 102 on substrates 104 can be controlled and/or determined by the nanoimprint master pattern 108 design together with the direct current (DC) anodization voltage, as further described herein, regarding FIGS. 14-15, etc.

Accordingly, in particular non-limiting aspects of the disclosed subject matter, a pattern such as an ordered nanohole array (e.g., a squarely ordered nanohole array) can be formed or defined on lower releasing layer of poly methyl methacrylate (PMMA) 802 and photoresist layer 804 on a pattern substrate 806 (e.g., a Si wafer 806) by photolithography, as exemplified in FIG. 8 (e.g., pattern substrate 806 with pattern 808). In further non-limiting aspects, one or more metallic substances 810 such as titanium, tungsten, and/or copper (Ti/W/Cu) can be sputtered on photoresist layer 804 as a seed layer (e.g., comprising a Ti/W layer 810 and a thin Cu layer 812) for subsequent metal electrodeposition or electroplating, as exemplified in FIG. 8 (e.g., pattern substrate 806 with pattern 808 and seed layer (810 and 812) (814)). In still further non-limiting aspects, a relatively thicker layer 816 of one or more metallic substances such as copper and/or nickel (Cu/Ni) can be electroplated or electrodeposited (e.g., electrodeposition of 20 μm Cu and 30 μm Ni) on the seed layer (810 and 812), as exemplified in FIG. 8 (e.g., pattern substrate 806 with seed layer (810 and 812) and layer 816). Accordingly, in further non-limiting aspects, layer 816 and seed layer (810 and 812) can be released as a flexible foil comprising the nanoimprint master pattern 108 from the pattern substrate 806, for example, by soaking and dissolving the lower releasing layer of PMMA 802 in acetone, as exemplified in FIG. 8 (e.g., pattern substrate 806 with dissolved lower releasing layer of PMMA removed (822) and flexible foil 820 comprising the nanoimprint master pattern 108).

In a particular non-limiting implementation, a nanoimprint master 108 (e.g., comprising a 2-D array of structures) can be fabricated by spin-coating a silicon wafer 806 at 4,000 revolutions per minute (rpm) with a double layer of photoresist with a lower releasing layer 802 of 100 nm of PMMA and an upper layer 804 of 200 nm of AZ7908 photoresist diluted with AZ® EL Thinner in 1:1 ratio. In a further non-limiting aspect, upper layer 804 of photoresist be patterned with a pattern such as an ordered nanohole array (e.g., squarely ordered nanohole array having pitch equal to a desired nanoimprint master pattern 108). The patterned wafer 808 can then be sputtered with 50 nm and 200 nm of TiW and Cu, respectively, as a seed layer (810 and 812) for subsequent electroplating, in a further non-limiting aspect. Accordingly, in still further non-limiting aspects, a layer 816, comprising 20 μm of copper, can be electroplated in electrolyte comprising 225 grams per liter (g/L) copper (II) sulfate ($CuSO_4$), 50 g/L sulfuric acid ($H_2SO_4$), and 50 parts per million (ppm) hydrochloric acid (HCl) at 0.2 amperes per square decimeter (ASD), followed by electroplating 30 μm nickel in electrolyte of 1:4 nickel sulfate at 0.5 ASD, to result in total 50 μm thick nanoimprint master pattern 108 foil on the pattern substrate 806. Accordingly, nanoimprint master pattern 108 foil on the pattern substrate 806 can be released from the pattern substrate 806 by soaking and dissolving the lower releasing layer 802 of PMMA in acetone for 1 hour, as exemplified in FIG. 8 (e.g., pattern substrate 806 with dissolved lower releasing layer of PMMA removed (822) and flexible foil 820 comprising the nanoimprint master pattern 108).

Figure 9:
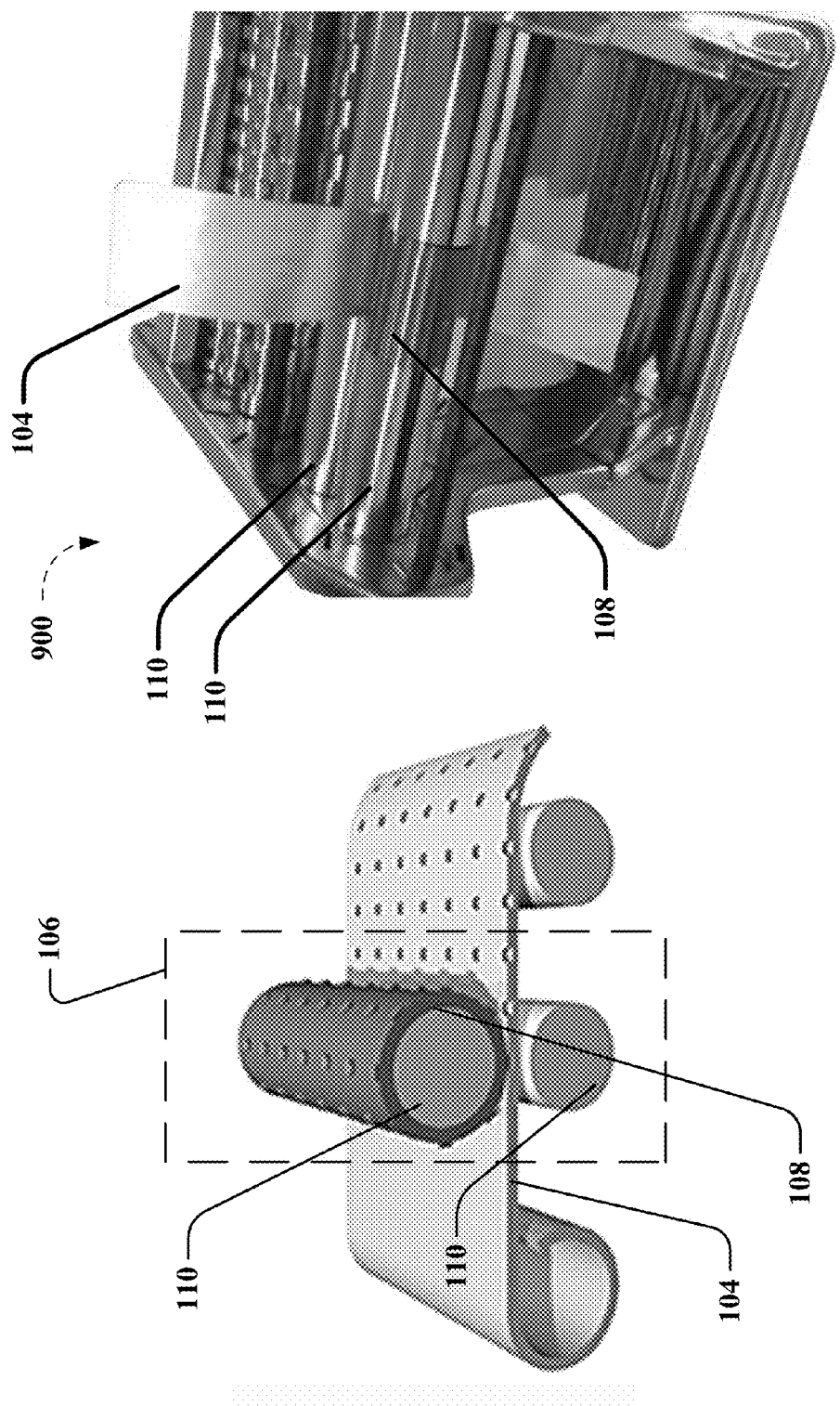
FIG. 9 demonstrates an exemplary non-limiting roll-to-roll processing apparatus that facilitates fabrication of predetermined or ordered 3-D nanostructures, according to a non-limiting aspect.

FIG. 9 demonstrates an exemplary non-limiting roll-to-roll processing apparatus 900 that facilitates fabrication of predetermined or ordered 3-D nanostructures 102 (e.g., nanopillars 206, nanoconcaves 208, etc.), according to further non-limiting aspects. Referring again to FIG. 1, various non-limiting implementations of the disclosed subject matter can facilitate nanoimprinting 106 of a substrate 104, which implementations can comprise roll-to-roll nanoimprinting 106 of the substrate 104 with a master pattern 108 (e.g., comprising a 2-D array of structures). For instance, master pattern 108 can be mounted on a roller system comprising two parallel cylinder rollers 110 as depicted in FIGS. 1 and 9. Thus, flexible foil 820 comprising the nanoimprint master pattern 108 can be shaped into a cylindrical shape and affixed to one of two parallel cylinder rollers 110 (e.g., using adhesive glue or other conventional means), to facilitate fabrication of a cylindrical pattern, such as the nanoimprint master pattern 108 (e.g., a 2-D array of structures).

In further aspects, a cylindrical pattern, such as the nanoimprint master pattern 108, can facilitate imprinting a substrate 104 with a 2-D pattern 214 comprising a 2-D array of structures against the substrate 104, where the 2-D pattern 214 can correspond to predetermined or ordered 3-D nanostructures 102 (e.g., nanopillars 206, nanoconcaves 208, etc.) to be formed on the substrate 104. Thus, FIG. 9 depicts an exemplary non-limiting roll-to-roll processing apparatus 900 that facilitates fabrication of predetermined or ordered 3-D nanostructures 102 (e.g., nanopillars 206, nanoconcaves 208, etc.), according to various non-limiting aspects. Accordingly, substrate 104, in roll form or otherwise, can be fed into the two parallel cylinder rollers 110 as depicted schematically in FIGS. 1 and 9, etc., to facilitate a roll-to-roll compatible processing with much higher scalability as compared with conventional batch processing. In addition, it is noted that various embodiments of the solution based anodization and etching processes described herein can also be roll-to-roll compatible. Accordingly, various non-limiting implementations of the disclosed subject matter can facilitate low-cost fabrication of flexible substrates 104 with highly regular predetermined or ordered 3-D nanostructures 102 (e.g., nanopillars 206, nanoconcaves 208, etc.). In addition, as noted, regular structures are preferred to obtain uniform coating of PV materials on the structures, for which conventional fabrication techniques involves batch lithography and RIE, and for which such fabrication techniques pose significant challenges in terms of cost reduction and scalability. Thus, the roll-to-roll compatible techniques, according to various non-limiting embodiments as described herein, that facilitate large scale fabrication of highly regular arrays of predetermined or ordered 3-D nanostructures 102 (e.g., nanopillars 206, nanoconcaves 208, etc.) on flexible substrates 104 can provide significant improvements in cost reduction and scalability.

Figure 10:
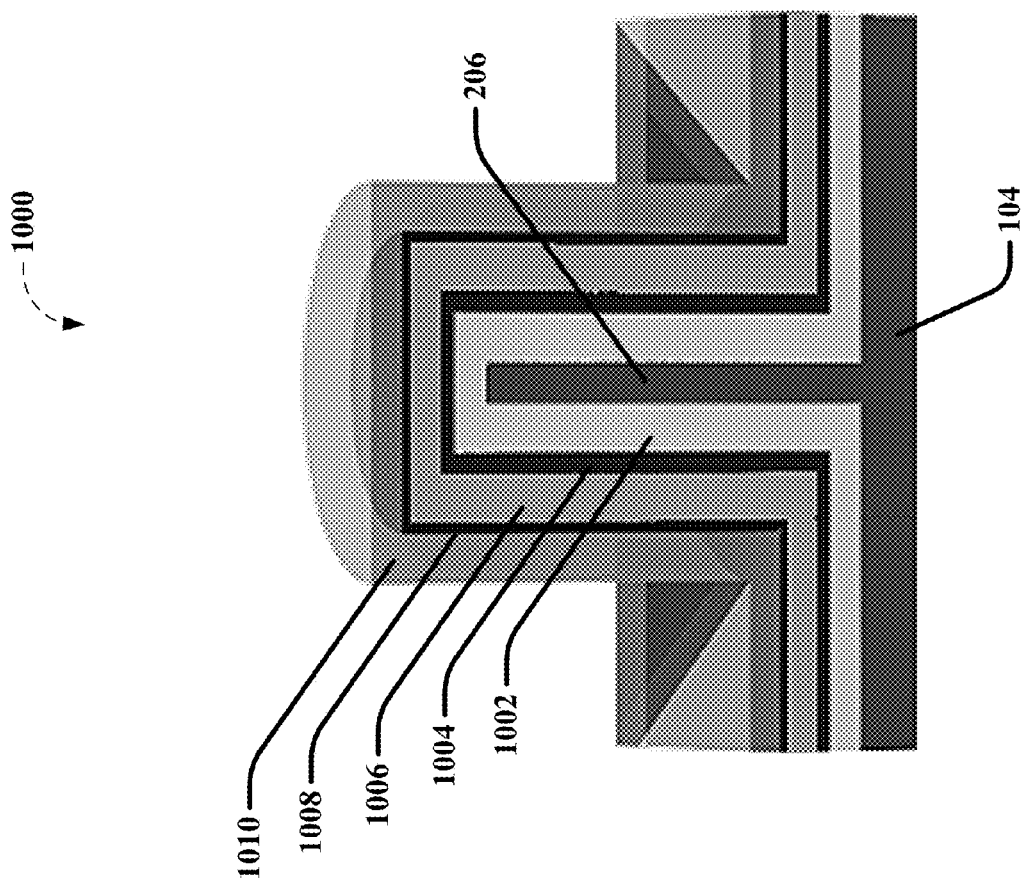
FIG. 10 depicts an exemplary schematic diagram of a non-limiting article of manufacture associated with one or more predetermined or ordered 3-D nanostructures, according to various non-limiting embodiments.

FIG. 10 depicts an exemplary schematic diagram of a non-limiting article of manufacture 1000 associated with one or more predetermined or ordered 3-D nanostructures 102 (e.g., one or more nanopillars 206), according to various non-limiting embodiments. It is noted that, for the purpose of description, and not limitation, article of manufacture 1000 is depicted as a singular 3-D nanostructure (e.g., nanopillar 206), for which one or more layer(s) 1002, 1004, 1006, 1008, and/or 1010, etc. can be formed over the array of ordered of 3-D nanostructures 102 (e.g., nanopillars 206, nanoconcaves 208, etc.). It can be understood that the singular 3-D nanostructure (e.g., nanopillar 206) as depicted in the article of manufacture 1000 can be readily replicated as described herein to produce a highly regular array of predetermined or ordered 3-D nanostructures 102 (e.g., a square-ordered array of 3-D nanostructures 102, a hexagonal-ordered array of 3-D nanostructures 102, etc.) on the substrate 104 (e.g., a roll of a metallic foil substrate 104, an aluminum foil substrate 104, or a metallic substance deposited on the substrate 104), according to various non-limiting examples as provided herein, for example, as depicted regarding FIG. 11.

For instance, in various non-limiting embodiments, article of manufacture 1000 can comprise a substrate 104 comprising an imprinted 2-D pattern (e.g., 2-D pattern 214). In a non-limiting aspect of article of manufacture 1000, the imprinted 2-D pattern can correspond to a 2-D array of structures of a pattern (e.g., a cylindrical pattern, such as nanoimprint master pattern 108) applied to the substrate 104. In a further non-limiting aspect of article of manufacture 1000, the 2-D array of structures can correspond to an ordered array of 3-D nanostructures 102 (e.g., nanopillars 206, nanoconcaves 208, etc.) formed on or to be formed on the substrate 104. In a yet another non-limiting aspect, article of manufacture 1000 can comprise the ordered array of 3-D nanostructures 102 (e.g., nanopillars 206, nanoconcaves 208, etc.) formed on the substrate 104. For instance, in various non-limiting embodiments of article of manufacture 1000, fabrication of the 3-D nanostructures can be facilitated by one or more of anodizing the substrate 104 and/or etching the anodized substrate 104. In still other various non-limiting embodiments of article of manufacture 1000, one or more of pitch or ordering of the 2-D array of structures can be configured to control and/or determine, one or more of spacing or morphology of the 3-D nanostructures 102 (e.g., nanopillars 206) of the ordered array of 3-D nanostructures 102 (e.g., nanopillars 206, nanoconcaves 208, etc.) formed on the substrate 104, for example.

According to further non-limiting aspects, article of manufacture 1000 can also comprise one or more layer(s) (e.g., one or more layer(s) 1002, 1004, 1006, 1008, and/or 1010, etc.) formed over the ordered array of 3-D nanostructures 102 (e.g., nanopillars 206, nanoconcaves 208, etc.). As a non-limiting example, the one or more layer(s) formed over the ordered array of 3-D nanostructures 102 (e.g., nanopillars 206, nanoconcaves 208, etc.) can comprise one or more of an amorphous silicon layer, an indium tin oxide layer, and/or other thin film PV materials, or materials associated therewith, including, but not limited to, cadmium/tellurium (Cd/Te) materials, and/or copper (indium/gallium) selenium (Cu(In,Ga)Se) PV materials, and/or any of a number of conventional insulation, passivation, isolation, contact and/or packaging layers or materials etc., to facilitate fabrication of high performance flexible thin film PV devices on an ordered array of 3-D nanostructures 102 (e.g., a nanopillar 206 array, a nanoconcave 208 array, etc.), as described herein. In a further non-limiting aspect, the one or more layer(s) formed over the ordered array of 3-D nanostructures 102 (e.g., nanopillars 206, nanoconcaves 208, etc.) can be facilitated by any of a number of conventional deposition techniques including, but not limited to, sputtering, plasma-enhanced chemical vapor deposition (PECVD), etc.

Figure 11:
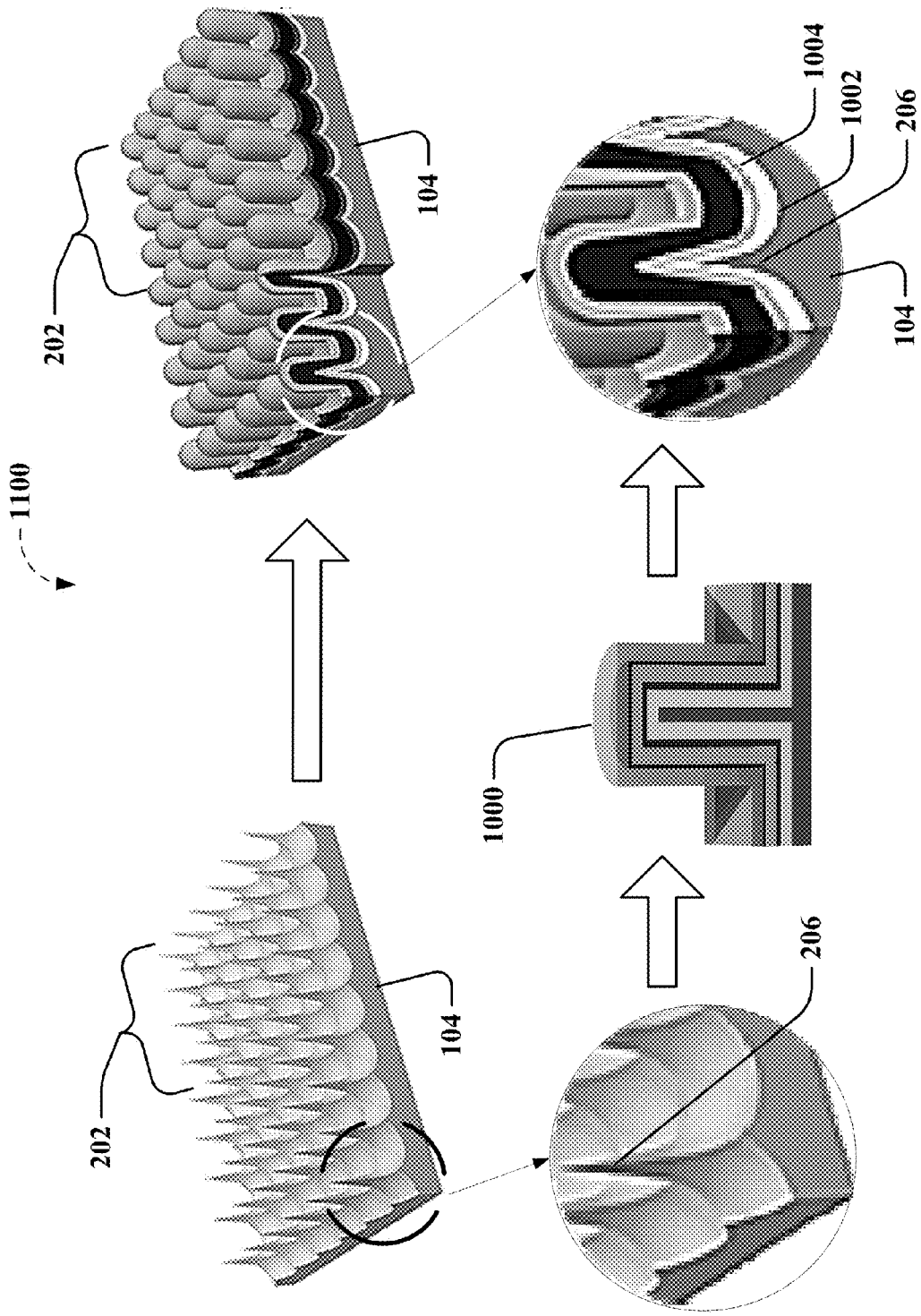
FIG. 11 depicts a further non-limiting schematic diagram of exemplary articles of manufacture associated with one or more predetermined or ordered 3-D nanostructures, according to various non-limiting embodiments.

For instance, FIG. 11 depicts a further non-limiting schematic diagram 1100 of exemplary articles of manufacture associated with one or more predetermined or ordered 3-D nanostructures 102 (e.g., nanopillars 206, nanoconcaves 208, etc.), according to various non-limiting embodiments. As a non-limiting example, FIG. 11 depicts a schematic representation of an ordered array (e.g., square-ordered 202 array) of 3-D nanostructures 102 (e.g., nanopillars 206) formed on substrate 104, according to further non-limiting aspects as described herein. In addition, FIG. 11 depicts exemplary non-limiting article of manufacture (e.g., article of manufacture 1000) fabricated on the square-ordered 202 array of 3-D nanostructures 102 (e.g., nanopillars 206) formed on substrate 104, for example, as further described above regarding FIG. 10. As can be understood, article of manufacture 1000 can comprise or be associated with any number of PV devices and/or materials, and without limitation, can comprise other articles of manufacture 1000 that can comprise or be associated with devices associated with antireflective coatings, or other devices that can employ structures or techniques as described herein (e.g., nanostructures fabrication techniques involving or related to control of process parameters (e.g., control of one or more of structure morphology, pitch, height, depth, spacing, ordering, etc.)) that facilitate formation of predetermined or ordered 3-D nanostructures 102 (e.g., nanopillars 206, nanoconcaves 208, etc.), etc.

As a non-limiting example, in a particular exemplary implementation, Al foil, cut into suitable sizes (e.g., 1.7 centimeter (cm) by 3.5 cm pieces and cleaned in acetone and isopropyl alcohol can serve as a suitable substrate 104. In a further non-limiting aspect, substrate 104 can be electrochemically polished in a 1:3 volume ratio (v:v) mixture of perchloric acid and ethanol for 2 minutes at 12 V and 10° Celsius (C), which can then be imprinted by nanoimprint master 108 (e.g., a squarely ordered pillar array with height of 200 nm and with various pitches of 1 µm, 1.2 µm, 1.5 µm and 2 µm), as described herein, with a pressure of approximately $2\times10^4$ Newtons per square centimeter (N cm$^{-2}$) to initiate ordered AAO growth. In yet another non-limiting aspect, imprinted substrate 104 with the AAO can be anodized with voltage equal to approximately pitch (nm)/2.5. It is noted that further non-limiting aspects associated with anodization techniques as described herein are further described below, for example regarding FIGS. 14 and 15. In addition, the AAO layer (e.g., AAO layer 210 or 212 formed on the imprinted and/or patterned Al substrate 104 can be etched in a mixture of chromic acid (1.5 weight percent (wt %)) and phosphoric acid (6 wt %) solutions at 100° C. for 15 minutes to expose the array of predetermined or ordered 3-D nanostructures 102 (e.g., nanopillars 206, nanoconcaves 208, etc.), which can be cleaned with deionized water and blown dry with compressed air.

While the preceding description of a particular non-limiting example provides an understanding of various aspects of the formation of predetermined or ordered 3-D nanostructures 102 (e.g., nanopillars 206, nanoconcaves 208, etc.), it can be understood that various modifications may be made, as described herein, or otherwise, to the various provided examples of the disclosed subject matter. It can be further understood that the fabrication techniques and associated regular arrays of predetermined or ordered 3-D nanostructures 102 (e.g., nanopillars 206, nanoconcaves 208, etc.) on substrates 104, as described herein, are compatible with light weight and flexible aluminum foil substrates 104, which can be fabricated into flexible PV devices (e.g., solar cells, etc.). The results as presented below indicate that described structures and techniques have the potential for fabricating cost-effective flexible thin film PV devices, due in part to the low-cost of fabrication processes, the exemplary substrate material, with its excellent flexibility, and due to the demonstrated improvement on PV performance, for example, as further described herein.

Exemplary Results

Figure 18:
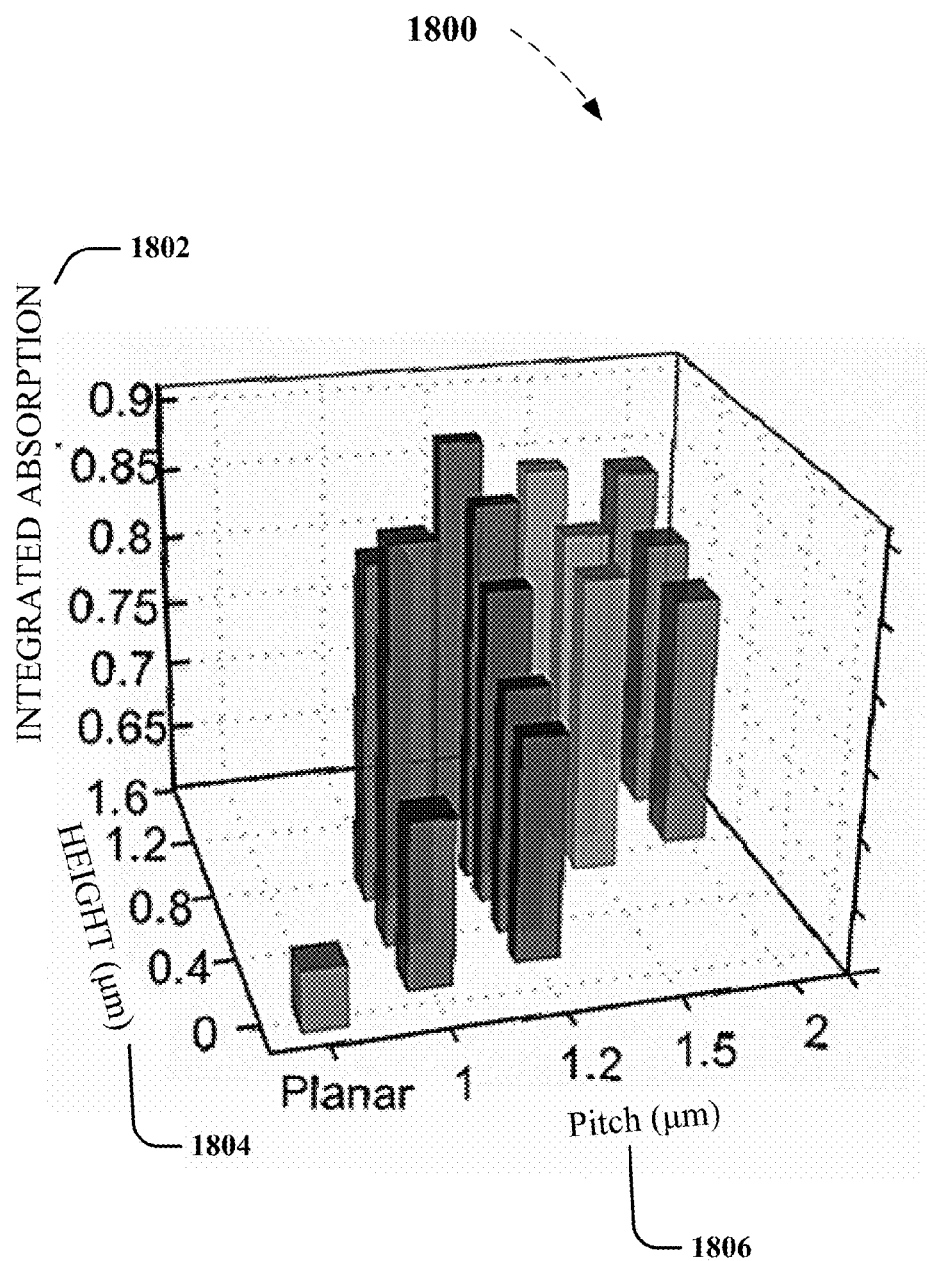
FIGS. 18-19 are graphs demonstrating various non-limiting aspects of performance of predetermined or ordered 3-D nanostructures and/or associated PV devices, according to various non-limiting aspects of the disclosed subject matter.

Exemplary embodiments of the disclosed subject matter have been explored to demonstrate particular non-limiting embodiments, aspects, and/or features. In addition, exemplary embodiments are demonstrated as compared with conventional planar PV devices. For example, regular arrays of predetermined or ordered 3-D nanostructures 102 (e.g., Al nanopillar 206 arrays) were fabricated with controlled nanopillar height and pitch, as described herein. For example, pitches of 1 µm, 1.2 µm, 1.5 µm and 2 µm were chosen in order to achieve acceptable film coating uniformity during PV device fabrication using PECVD and sputtering processes. According to various non-limiting embodiments, a-Si PV device characterization using these nanopillar 206 arrays as a template shows that performance is significantly improved as compared with the planar PV device control, for example, as depicted in FIG. 18. Such enhancement can be attributed to more efficient light absorption as evidenced by higher short current density ($J_{sc}$) over the planar PV device control as well as the optical absorption of PV devices having different heights and pitches of predetermined or ordered 3-D nanostructures 102 (e.g., nanopillars 206, nanoconcaves 208, etc.) formed on substrates 104 as shown in FIG. 18.

Morphologies of regular arrays of predetermined or ordered 3-D nanostructures 102 (e.g., nanopillars 206, nanoconcaves 208, etc.) formed on substrates 104 and deposited thin films were examined by SEM using a JEOL6700F at an accelerating voltage of 5 kilovolts (kV) and a Digital Instruments Dimension 3000 Atomic Force Microscope. The current-voltage (I-V) characteristics of PV devices were characterized by Oriel solar simulator, 450 Watt Xenon lamp, AM 1.5 global illumination with output calibrated to 1 sun (100 milliwatts per centimeter squared (mW cm$^{-2}$)) with mono-crystalline reference cell (Newport Corp., 91150V) and Keithley 2400 source meter.

Figure 12:
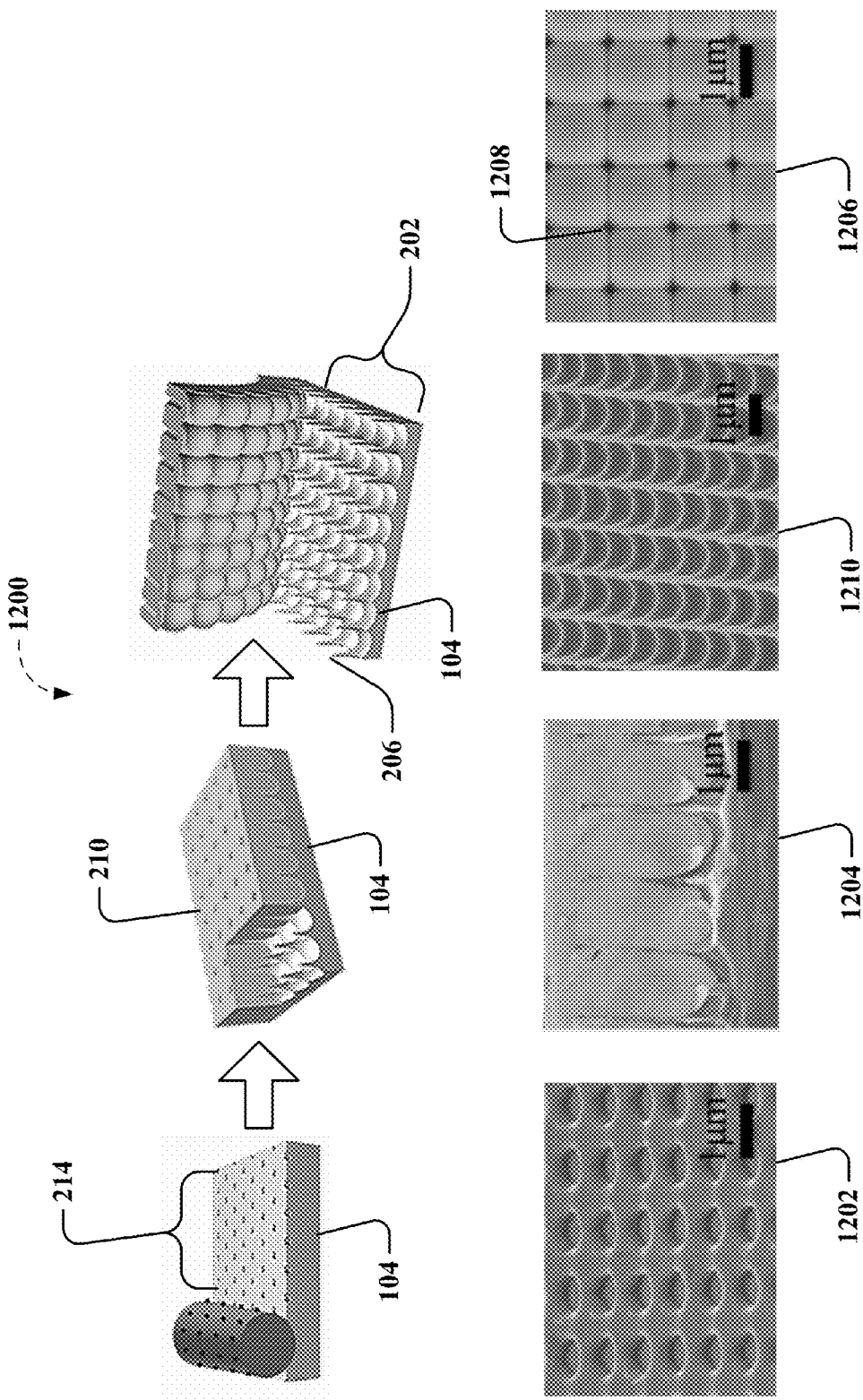
FIGS. 12-13 depict non-limiting schematic diagrams of exemplary articles of manufacture associated with one or more predetermined or ordered 3-D nanostructures, with associated scanning electron microscopy (SEM) micrographs demonstrating various exemplary aspects of process control (e.g., control of one or more of structure morphology, pitch, height, depth, spacing, ordering, etc.), according to various non-limiting embodiments.
Figure 13:
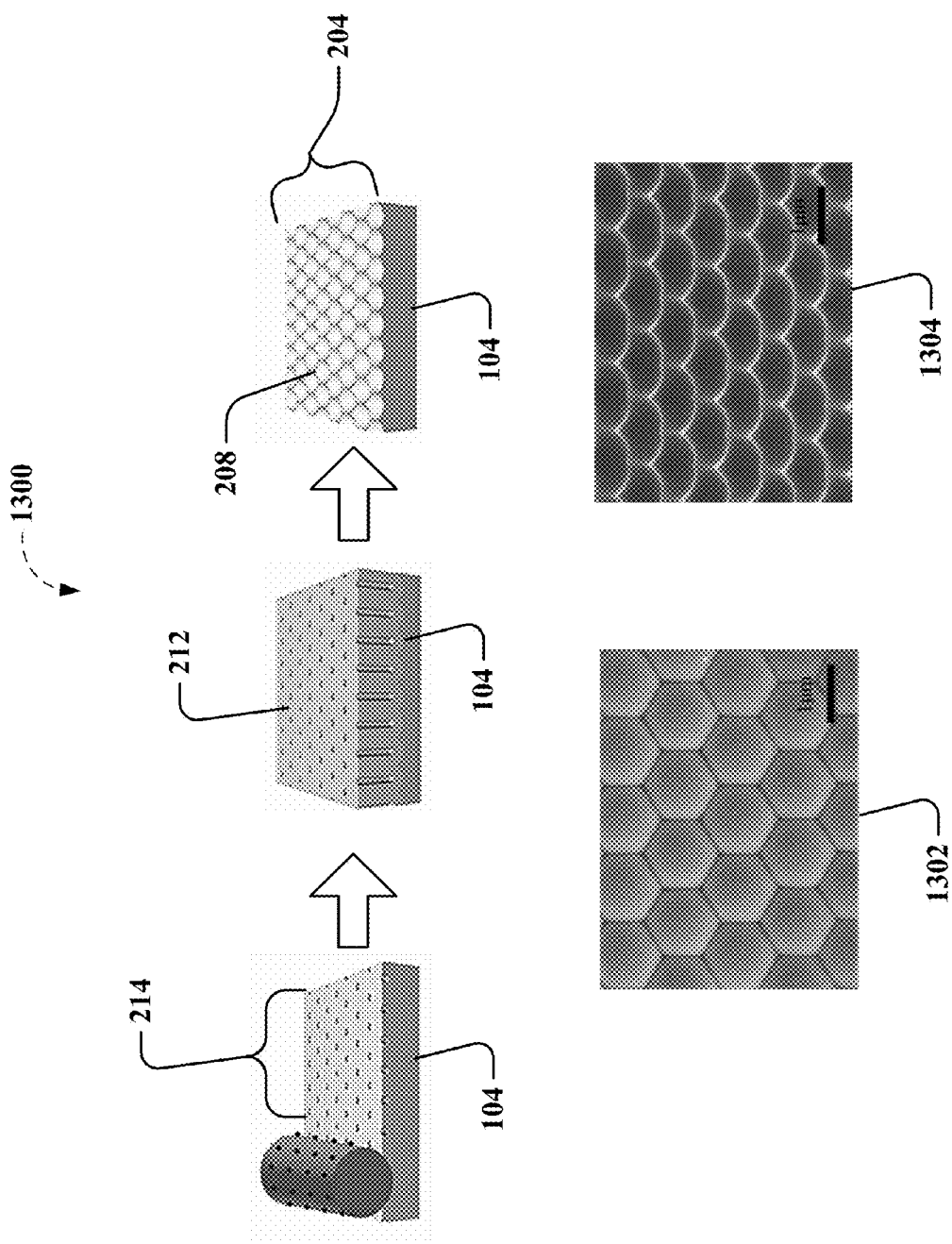

FIGS. 12-13 depict non-limiting schematic diagrams of exemplary articles of manufacture associated with one or more predetermined or ordered 3-D nanostructures 102 (e.g., nanopillars 206, nanoconcaves 208, etc.), with associated scanning SEM micrographs demonstrating various exemplary aspects of process control (e.g., control of one or more of structure morphology, pitch, height, depth, spacing, ordering, etc.), according to various non-limiting embodiments. As a non-limiting example, FIG. 12 depicts a schematic diagram of the formation of predetermined or ordered 3-D nanostructures 102 (e.g., square-ordered nanopillars 206) by a nanoimprint process as described herein, wherein the imprinted 2-D pattern 214 corresponds to the master pattern 108 comprising a 2-D array of structures. Thus, the nanoimprint process 106 can facilitate producing a squarely-ordered 202 nano-indentation pattern 214 on a clean and flat Al foil substrate 104, in a non-limiting embodiment, as demonstrated in accompanying SEM image 1202. The Al foil substrate 104 can then be anodized in an acidic solution with a desirable direct current (DC) voltage, as further described herein. It is noted that a solution based Al anodization process can be understood to facilitate formation of porous alumina ($Al_2O_3$) films on Al substrates with local hexagonal pore ordering, due to the fact that the honeycomb structure is the most stable structure in nature.

However, by employing the square-ordered 202 nanoimprint pattern 214, the nanoimprint process 106, in conjunction with the anodization process, various aspects of the disclosed subject matter can facilitate introduction of periodic defects in the alumina ($Al_2O_3$) films on Al substrates 104. As the square-ordered 202 pattern 214 is not naturally stable, it can be understood that voids form between unit cells of the alumina ($Al_2O_3$) films during anodization for example, as further described herein regarding FIG. 12. For instance, FIG. 12 depicts a schematic diagram of the formation of predetermined or ordered 3-D nanostructures 102 (e.g., square-ordered nanopillars 206) by a nanoimprint process 106 as described herein and an accompanying SEM image 1202 of a patterned Al foil substrate 104, wherein the imprinted 2-D pattern 214 corresponds to the master pattern 108 comprising a 2-D array of structures. SEM image 1204 of square-ordered nanopillars 206 demonstrates formation of squarely ordered AAO 210 and Al square-ordered nanopillars 206. SEM image 1206 demonstrates the squarely ordered nature of AAO 210, as viewed from the bottom of the AAO 210, opposite substrate 104, with the square-ordered 202 periodic voids 1208 apparent in the AAO 210. Upon AAO 210 removal to expose Al square-ordered nanopillars 206, SEM 1210 demonstrates the highly regular array of predetermined or ordered 3-D nanostructures 102 (e.g., Al square-ordered nanopillars 206) having approximately 1.2 µm pitch and approximately 1.2 µm height.

Thus, according to a further non-limiting aspect of the disclosed subject matter, such voids 1208 can be filled with the un-anodized Al material during the formation of porous alumina, as shown in SEM image 1204 of FIG. 12. Accordingly, the formation of predetermined or ordered 3-D nanostructures 102 (e.g., square-ordered nanopillars 206) can be revealed and/or exposed by etching away of alumina (e.g., via a wet chemical etch, etc.), as described herein. Thus, various aspects of the disclosed subject matter facilitates formation of predetermined or ordered 3-D nanostructures 102 (e.g., square-ordered nanopillars 206) by square-pattern 202 nanoimprint process 106 assisted anodization. This can be further seen in the bottom view of the AAO SEM image 1206 of FIG. 12, in which the periodic voids 1208 can be conspicuously resolved. In contrast, the bottom surface of a hexagonally ordered porous AAO film is depicted in SEM image 1302 of FIG. 13, for which, no corresponding void is observed, and for which, further non-limiting aspects of the disclosed subject matter facilitate formation of predetermined or ordered 3-D nanostructures 102 (e.g., Al hexagonal-ordered nanoconcaves 208) having peak to valley height difference of about 209 nanometers (nm).

For example, FIG. 13 depicts a schematic diagram of the formation of predetermined or ordered 3-D nanostructures 102 (e.g., Al hexagonal-ordered nanoconcaves 208) by a nanoimprint process 106 as described herein, wherein the imprinted 2-D pattern 214 corresponds to the master pattern 108 comprising a 2-D array of structures. Accompanying SEM image 1302 clearly shows the hexagonally ordered nature of AAO 212, as viewed from the bottom of the AAO 212, opposite substrate 104. Upon AAO 212 removal to expose Al hexagonal-nanoconcaves 208, SEM 1304 demonstrates the highly regular array of predetermined or ordered 3-D nanostructures 102 (e.g., Al hexagonal-ordered nanoconcaves 208).

Figure 14:
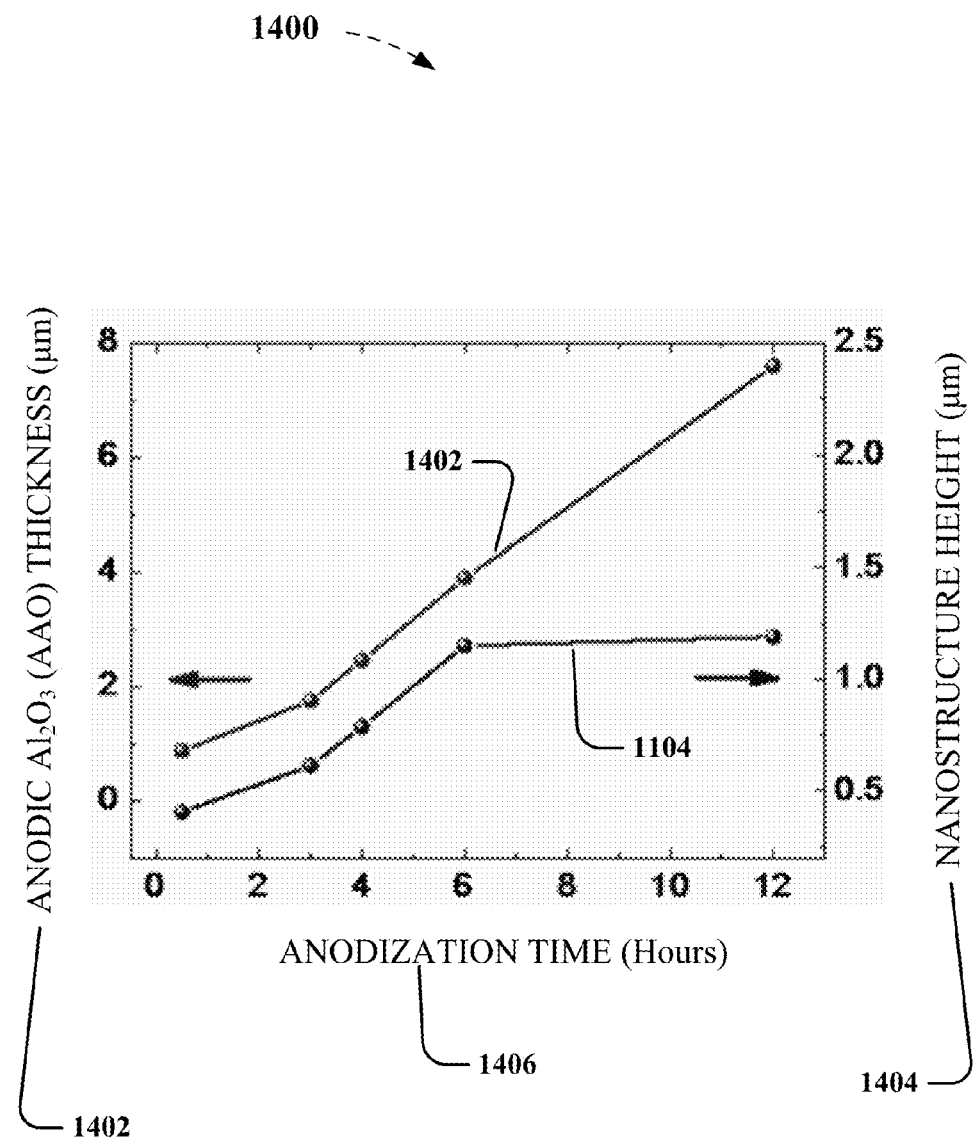
FIG. 14 is a graph demonstrating non-limiting aspects of process control (e.g., control of one or more of structure morphology, pitch, height, depth, spacing, ordering, etc.) that facilitates formation of predetermined or ordered 3-D nanostructures, according to various non-limiting embodiments.

FIG. 14 is a graph 1400 demonstrating non-limiting aspects of process control (e.g., control of one or more of structure morphology, pitch, height, depth, spacing, ordering, etc.) that facilitates formation of predetermined or ordered 3-D nanostructures 102 (e.g., nanopillars 206, nanoconcaves 208, etc.), according to various non-limiting embodiments. For instance, FIG. 14 demonstrates the relationship of AAO (210, 212) thickness 1402 and predetermined or ordered 3-D nanostructures 102 height 1404 with anodization time 1406. For instance, it can be seen that that the predetermined or ordered 3-D nanostructures 102 height 1404 can be readily tuned via controlling anodization time 1406. However, it can also be seen that beyond a particular time, the predetermined or ordered 3-D nanostructures 102 height 1404 does not increase after a particular anodization time 1406, whereas it is noted that the predetermined or ordered 3-D nanostructures 102 greatest height 1404 is found to be approximately equal to the corresponding pitch.

FIG. 15 tabulates various non-limiting examples 1500 of process parameters related to anodization of an imprinted substrate 104, according to further non-limiting embodiments. For instance, it can be seen in FIG. 15, as with FIG. 14, that shape and/or height of predetermined or ordered 3-D nanostructures 102, depends, in part, on anodization time for a particular pitch of predetermined or ordered 3-D nanostructures 102 (e.g., nanopillars 206, nanoconcaves 208, etc.) on an imprinted substrate 104. For instance, for a pitch of 1200 nm, and constant voltage, temperature, and electrolyte composition, an increase in anodization time generally results in an increase in height of predetermined or ordered 3-D nanostructures 102 (e.g., nanopillars 206, nanoconcaves 208, etc.) on an imprinted substrate 104, as noted above, regarding FIG. 14.

Figure 16:
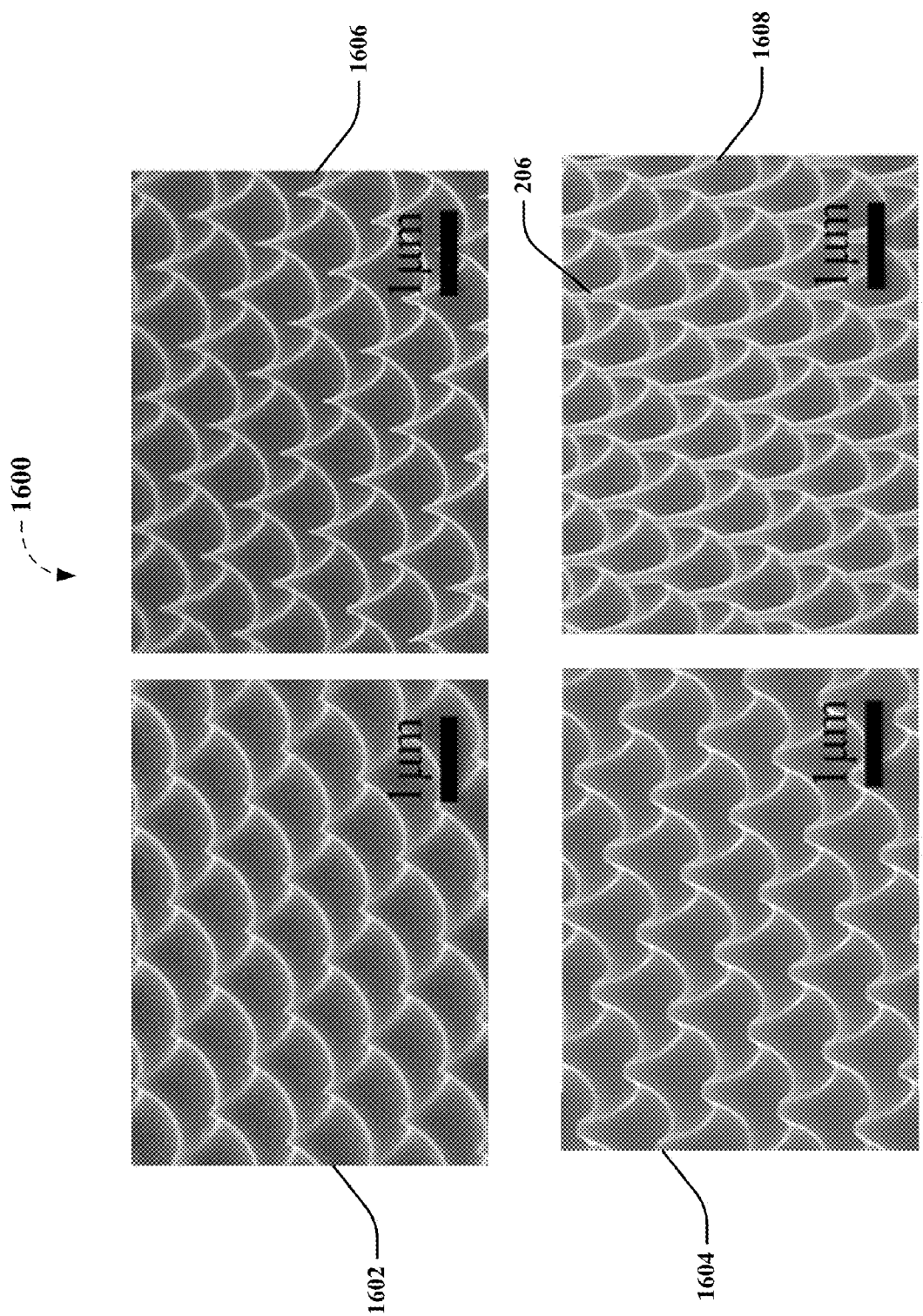
FIGS. 16-17 depict SEM micrographs of other exemplary non-limiting embodiments of articles of manufacture associated with one or more predetermined or ordered 3-D nanostructures demonstrating further non-limiting aspects of process control (e.g., control of one or more of structure morphology, pitch, height, depth, spacing, ordering, etc.), according to various non-limiting embodiments.
Figure 17:
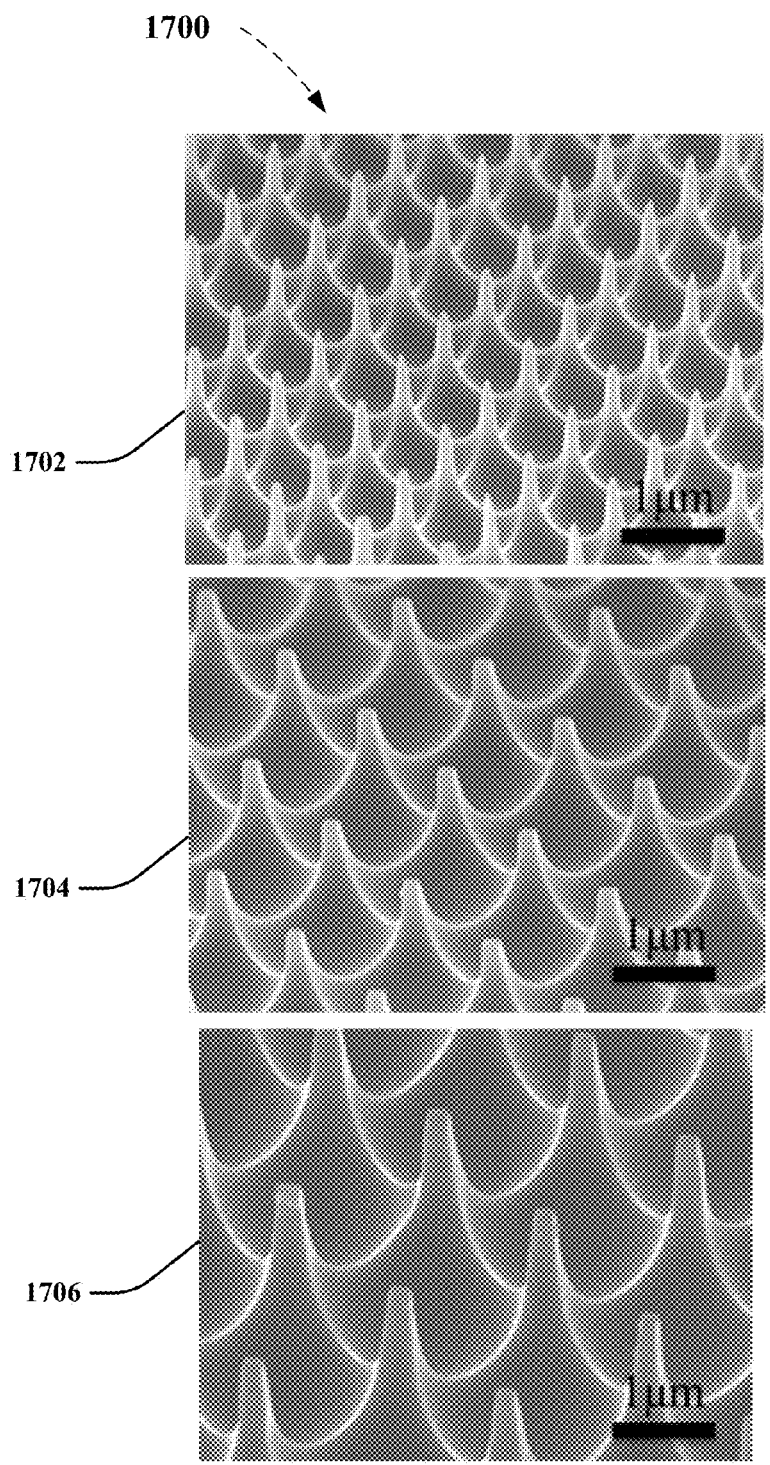

FIGS. 16-17 depict SEM micrographs of other exemplary non-limiting embodiments of articles of manufacture associated with one or more predetermined or ordered 3-D nanostructures demonstrating further non-limiting aspects of process control (e.g., control of one or more of structure morphology, pitch, height, depth, spacing, ordering, etc.), according to various non-limiting embodiments. For instance, FIG. 16 depicts four SEM micrographs, 1602, 1604, 1606, and 1608, demonstrating highly regular predetermined or ordered 3-D nanostructures 102 (e.g., square-ordered nanopillars 206) and having corresponding peak to valley height differences of approximately 420 nm, 614 nm, approximately 810 nm, and 1151 nm, respectively, and having pitch of 1.2 µm, for example, as noted in the table of FIG. 15, described above. Note that the predetermined or ordered 3-D nanostructures 102 were formed after anodization time of 3 hours (1604) and 6 hours (1608), whereas for an anodization time of 30 minutes, predetermined or ordered 3-D nanostructures 102 remained nanoconcave (having peak to valley height differences of 209 nm; not shown), which can indicate that a structural transformation from nanoconcave 208 to nanopillar 206 form occurs, based in part on anodization conditions (e.g., anodization time, etc.). Note that while heights of predetermined or ordered 3-D nanostructures 102 (e.g., nanopillars 206, nanoconcaves 208, etc.) were obtained using atomic force microscopy (AFM), for some aspects ratios of predetermined or ordered 3-D nanostructures 102 (e.g., as exemplified in 1604 and 1608), the AFM probe cannot fully follow contours of due to the high aspect ratio of the nanostructures.

In FIG. 17, three 60-degree tilted view SEM micrographs, 1702, 1704, and 1706, demonstrating highly regular predetermined or ordered 3-D nanostructures 102 (e.g., square-ordered nanopillars 206) and having corresponding pitches of 1 µm, 1.5 µm, and 2 µm, respectively. Thus, in further non-limiting implementations of the disclosed subject matter, various heights and/or pitches of highly regular predetermined or ordered 3-D nanostructures 102 can be fabricated, for which further thin film deposition can be made, as further described herein.

Figure 19:
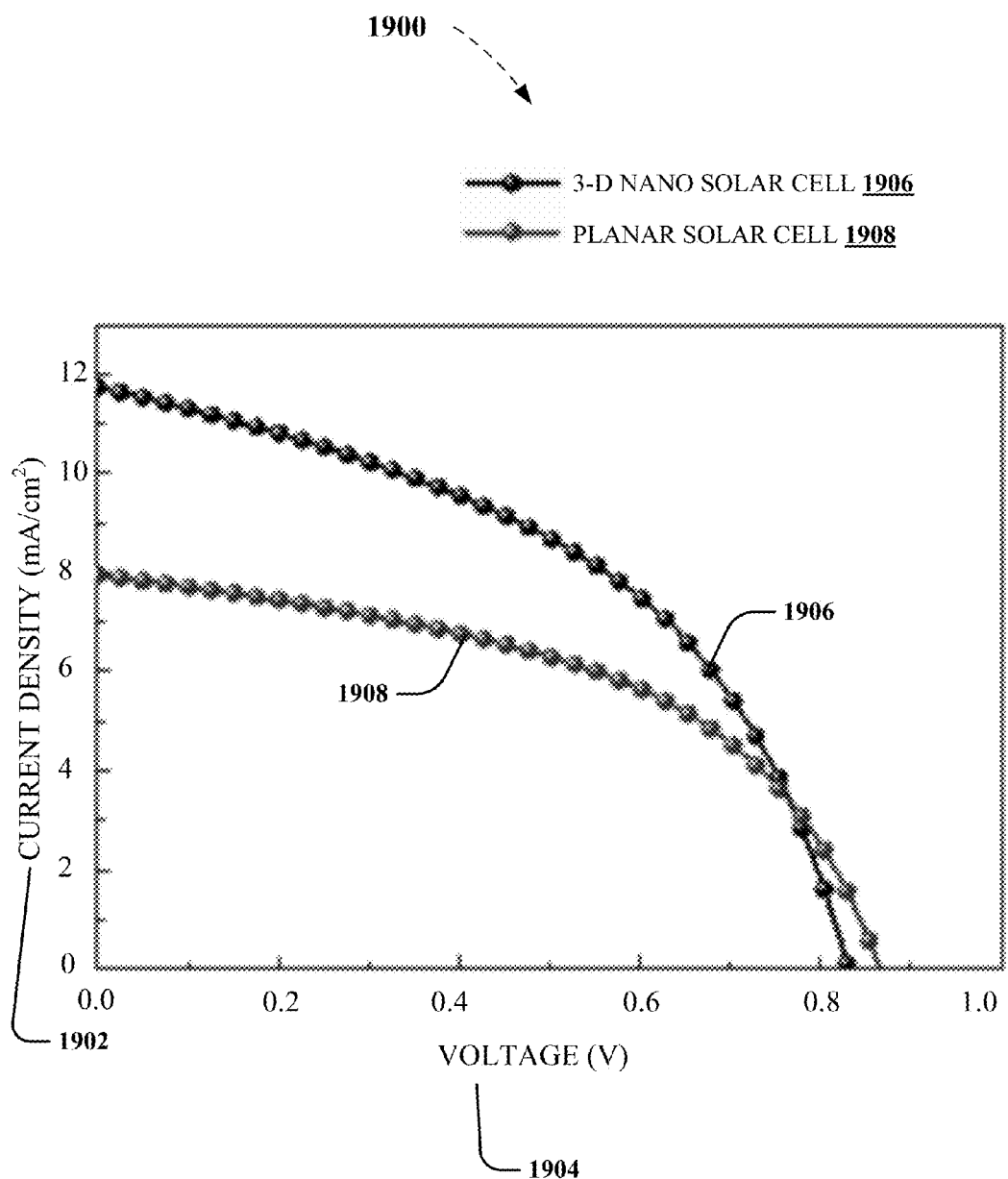

FIGS. 18-19 are graphs demonstrating various non-limiting aspects of performance of predetermined or ordered 3-D nanostructures and/or associated PV devices, according to various non-limiting aspects of the disclosed subject matter. According to particular non-limiting embodiments, substrates 104 comprising Al substrates 104, upon which predetermined or ordered 3-D nanostructures 102 have been formed, can have one or more layer(s) formed over the predetermined or ordered 3-D nanostructures 102 comprising a thin film of photovoltaic material, an amorphous silicon layer, an indium tin oxide layer, etc., as further described herein, for example, regarding FIGS. 10-11.

In FIG. 18, for example, optical absorption 1802 for PV devices on predetermined or ordered 3-D nanostructures 102 formed on substrates 104 is shown to outperform PV devices on planar substrates. For instance, FIG. 18 depicts Air mass 1.5 global (AM 1.5G) spectrum integrated above-band-gap solar cell device optical absorption 1802 acquired after measuring the absorption spectra of PV devices of different heights 1804 and pitches 1806 of predetermined or ordered 3-D nanostructures 102 formed on substrates 104. From FIG. 18, it can be seen that optical absorption for PV devices associated with the regular arrays of predetermined or ordered 3-D nanostructures 102 is much higher than that of the planar PV device control, which can only absorb about 64% of the solar spectrum. It can be also seen that device optical absorption 1802 monotonically increases with the height of predetermined or ordered 3-D nanostructures 102 for pitches 1806 of 1.2 µm, 1.5 µm, and 2 µm, with the optimal absorption 1802 of 88.8% for PV devices associated with the predetermined or ordered 3-D nanostructures 102 having 1.2 μm pitch 1806 and 1.2 μm height 1804.

Accordingly, it can be understood that, in various non-limiting embodiments, embodiments of the disclosed subject matter having higher aspect ratio predetermined or ordered 3-D nanostructures 102 can facilitate improved light trapping and/or management. However, it is noted that increasing pitch 1806 size for the same height 1804 predetermined or ordered 3-D nanostructures 102 can result in reduction of light absorption 1802, which can be attributed the reduced light scattering with large nanostructure 102 to nanostructure 102 (e.g., nanopillar 206 to nanopillar 206, etc.) distance at large pitch 1806. It is also noted that device optical absorption 1802 for 1 μm pitch 1804 predetermined or ordered 3-D nanostructures 102 shows a maximum at approximately 438 nm height 1806, which can be understood to be due to relatively high material filling ratio for high aspect ratio predetermined or ordered 3-D nanostructures 102 with 1 μm pitch 1806, which can lead to high optical reflectance on the top surface of PV structures associated with regular arrays of predetermined or ordered 3-D nanostructures 102. In other words, it can be understood that reductions in light absorption 1802 of PV structures associated with regular arrays of predetermined or ordered 3-D nanostructures 102 tend to occur as either the top or bottom surface of the PV structure approaches a planar surface. Accordingly, analysis on device optical absorption of FIG. 18 indicates that, in general, high aspect ratio structures with an appropriate gap in between, favor light trapping, but employing such high aspect ratio structures may involve tradeoffs with requirements for optimal PV device electrical performance, for example, as further described herein.

In addition, performance of thin film PV devices utilizing regular arrays of predetermined or ordered 3-D nanostructures 102 on substrates 104 could be significantly improved as compared with that of PV devices on planar substrates. For instance, for the non-limiting examples in FIG. 19, comparison of PV current 1902 voltage 1904 performance between a PV device associated with predetermined or ordered 3-D nanostructures 102 on substrates 104 (e.g., 3-D NANO SOLAR CELL 1906 on exemplary non-limiting implementation of highly regular predetermined or ordered 3-D nanostructures 102 (e.g., square-ordered nanopillars 206) and having corresponding peak to valley height differences of approximately 614 nm and having pitch of 1.2 μm, for example, as depicted in SEM micrograph 1604 and as noted in the table of FIG. 15) and planar PV device control (e.g., PLANAR 1908) reveals that the PV device associated with predetermined or ordered 3-D nanostructures 102 (1906) shows better short circuit current, open circuit voltage, and approximately 30% improvement in solar energy conversion efficiency over the planar PV device control 1908.

What has been described above includes examples of the embodiments of the disclosed subject matter. It is, of course, not possible to describe every conceivable combination of configurations, components, and/or methods for purposes of describing the claimed subject matter, but it is to be appreciated that many further combinations and permutations of the various embodiments are possible. Accordingly, the claimed subject matter is intended to embrace all such alterations, modifications, and variations that fall within the spirit and scope of the appended claims. While specific embodiments and examples are described in disclosed subject matter for illustrative purposes, various modifications are possible that are considered within the scope of such embodiments and examples, as those skilled in the relevant art can recognize.

In addition, the words "example" or "exemplary" is used herein to mean serving as an example, instance, or illustration. Any aspect or design described herein as "exemplary" is not necessarily to be construed as preferred or advantageous over other aspects or designs. Rather, use of the word, "exemplary," is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

In addition, while an aspect may have been disclosed with respect to only one of several embodiments, such feature may be combined with one or more other features of the other embodiments as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements. Numerical data, such as temperatures, concentrations, times, ratios, and the like, are presented herein in a range format. The range format is used merely for convenience and brevity. The range format is meant to be interpreted flexibly to include not only the numerical values explicitly recited as the limits of the range, but also to include all the individual numerical values or sub-ranges encompassed within the range as if each numerical value and sub-range is explicitly recited. When reported herein, any numerical values are meant to implicitly include the term "about." Values resulting from experimental error that can occur when taking measurements are meant to be included in the numerical values.

What is claimed is:

1. A method, comprising:
    receiving a foil substrate from a roll;
    imprinting the foil substrate as the foil substrate is transferred from the roll with a pattern comprising rolling a cylindrical pattern comprising a two-dimensional 2-D array of structures against the foil substrate, wherein the pattern corresponds to predetermined three-dimensional (3-D) nanostructures to be formed on the foil substrate; and
    forming the predetermined 3-D nanostructures on the foil substrate comprising anodizing the foil substrate resulting in an anodized foil substrate.

2. The method of claim 1, wherein the imprinting the foil substrate comprises imprinting the foil substrate with at least one of a square-ordered pattern that corresponds to 3-D nanopillars or a hexagonal-ordered pattern that corresponds to 3-D nanoconcaves.

3. The method of claim 1, wherein the rolling the cylindrical pattern comprises rolling the cylindrical pattern comprising the 2-D array of structures of a predetermined pitch, and wherein the pattern corresponds to a predetermined spacing of the predetermined 3-D nanostructures.

4. The method of claim 1, wherein the rolling the cylindrical pattern against the foil substrate comprises rolling the cylindrical pattern against a metallic foil substrate.

5. The method of claim 4, wherein the rolling the cylindrical pattern against the metallic foil substrate comprises rolling the cylindrical pattern against an aluminum foil substrate.

6. The method of claim 1, further comprising fabricating the cylindrical pattern by forming a master pattern that corresponds to the cylindrical pattern on a pattern substrate via photolithography.

7. The method of claim 6, further comprising:
electroplating at least one metallic substance on the master pattern;
releasing the at least one metallic substance from the master pattern and the pattern substrate; and
shaping the at least one metallic substance into a cylindrical shape.

8. The method of claim 1, wherein the rolling the cylindrical pattern comprises at least one of intermittently or continuously rolling the cylindrical pattern.

9. The method of claim 1, further comprising forming at least one layer formed over the predetermined 3-D nanostructures on the foil substrate comprising at least one of an amorphous silicon layer or an indium tin oxide layer.

10. The method of claim 1, wherein the forming the predetermined 3-D nanostructures comprises forming at least one of a square-ordered array or a hexagonal-ordered array on the foil substrate.

11. The method of claim 1, wherein the forming the predetermined 3-D nanostructures comprises forming at least one of a nanopillar array or a nanoconcave array on the foil substrate.

12. The method of claim 1, wherein the forming the predetermined 3-D nanostructures further comprises etching the anodized foil substrate.

13. A method, comprising:
receiving, from a roll, a foil substrate comprising an imprinted pattern, wherein the imprinted pattern corresponds to a cylindrical pattern applied to the foil substrate, and wherein the imprinted pattern corresponds to a two-dimensional (2-D) array of structures on the cylindrical pattern; and
forming ordered three-dimensional (3-D) nanostructures on the foil substrate, wherein the ordered 3-D nanostructures correspond to the pattern, and wherein the forming the ordered 3-D nanostructures comprises anodizing the foil substrate resulting in an anodized foil substrate.

14. The method of claim 13, wherein the receiving the foil substrate further comprises receiving a metallic foil substrate.

15. The method of claim 13, wherein the receiving the foil substrate further comprises receiving an aluminum foil substrate.

16. The method of claim 13, wherein the forming the ordered 3-D nanostructures comprises forming at least one of a square-ordered array or a hexagonal-ordered array on the foil substrate.

17. The method of claim 13, wherein the forming the ordered 3-D nanostructures comprises forming at least one of a nanopillar array or a nanoconcave array.

18. The method of claim 17, wherein the forming the nanopillar array comprises forming the nanopillar array with a height of between about 500 nanometers to about 2.5 micrometers.

19. The method of claim 13, wherein the anodizing the foil substrate further comprises anodizing the foil substrate in a mixture of citric acid, phosphoric acid, ethylene glycol, and deionized water.

20. The method of claim 13, wherein the anodizing the foil substrate further comprises anodizing the foil substrate with a direct current voltage comprising a value between about 200 volts (V) to about 750 V.

21. The method of claim 13, wherein the forming the ordered 3-D nanostructures further comprises etching the anodized foil substrate.

22. The method of claim 21, wherein the etching the anodized foil substrate comprises etching the anodized foil substrate with an acidic solution.

* * * * *